(12) United States Patent
Ko et al.

(10) Patent No.: US 11,069,845 B2
(45) Date of Patent: Jul. 20, 2021

(54) LIGHT EMITTING DEVICE

(71) Applicant: Samsung Electronics Co., Ltd., Suwon-si (KR)

(72) Inventors: Min-gu Ko, Yongin-si (KR); Jung-hee Kwak, Hwaseong-si (KR); Young-ho Ryoo, Suwon-si (KR); Seong-seok Yang, Hwaseong-si (KR); Sang-seok Lee, Seoul (KR); Seung-wan Chae, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 91 days.

(21) Appl. No.: 16/359,470

(22) Filed: Mar. 20, 2019

(65) Prior Publication Data

US 2020/0006611 A1 Jan. 2, 2020

(30) Foreign Application Priority Data

Jun. 29, 2018 (KR) .................. 10-2018-0075851

(51) Int. Cl.

| | | |
|---|---|---|
| *H01L 33/32* | (2010.01) | |
| *H01L 33/62* | (2010.01) | |
| *H01L 27/15* | (2006.01) | |
| *H01L 33/40* | (2010.01) | |

(52) U.S. Cl.
CPC ............ *H01L 33/62* (2013.01); *H01L 27/156* (2013.01); *H01L 33/32* (2013.01); *H01L 33/405* (2013.01)

(58) Field of Classification Search
CPC ............................ H01L 27/156; H01L 33/62
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |

(Continued)

FOREIGN PATENT DOCUMENTS

| | | |
|---|---|---|
| KR | 10-2013-0087894 | 8/2013 |
| KR | 10-1364773 | 2/2014 |

(Continued)

*Primary Examiner* — Kenneth Parker
*Assistant Examiner* — Long H Le
(74) *Attorney, Agent, or Firm* — Muir Patent Law, PLLC

(57) ABSTRACT

A light emitting device includes a substrate extending in a first direction and a second direction, first through fourth light emitting structures spaced apart from each other in the first and second direction and arranged in a matrix form on the substrate, a plurality of first interconnection layer structures connecting the first light emitting structure to the second light emitting structure, a second interconnection layer structure connecting the second light emitting structure to the third light emitting structure, and a plurality of third interconnection layer structures connecting the third light emitting structure to the fourth light emitting structure.

12 Claims, 22 Drawing Sheets

(56) References Cited

U.S. PATENT DOCUMENTS

| | | |
|---|---|---|
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,236,532 B2 | 12/2016 | Lee et al. |
| 2006/0192223 A1 | 8/2006 | Lee et al. |
| 2012/0043563 A1 | 2/2012 | Ibbetson et al. |
| 2017/0186917 A1 | 6/2017 | Jeon et al. |
| 2018/0204979 A1* | 7/2018 | Moon .................. H01L 27/156 |
| 2018/0294391 A1* | 10/2018 | Emura ................ H01L 27/156 |

FOREIGN PATENT DOCUMENTS

| | | |
|---|---|---|
| KR | 10-2017-0011138 | 2/2017 |
| WO | WO 2015-190817 | 12/2015 |

\* cited by examiner

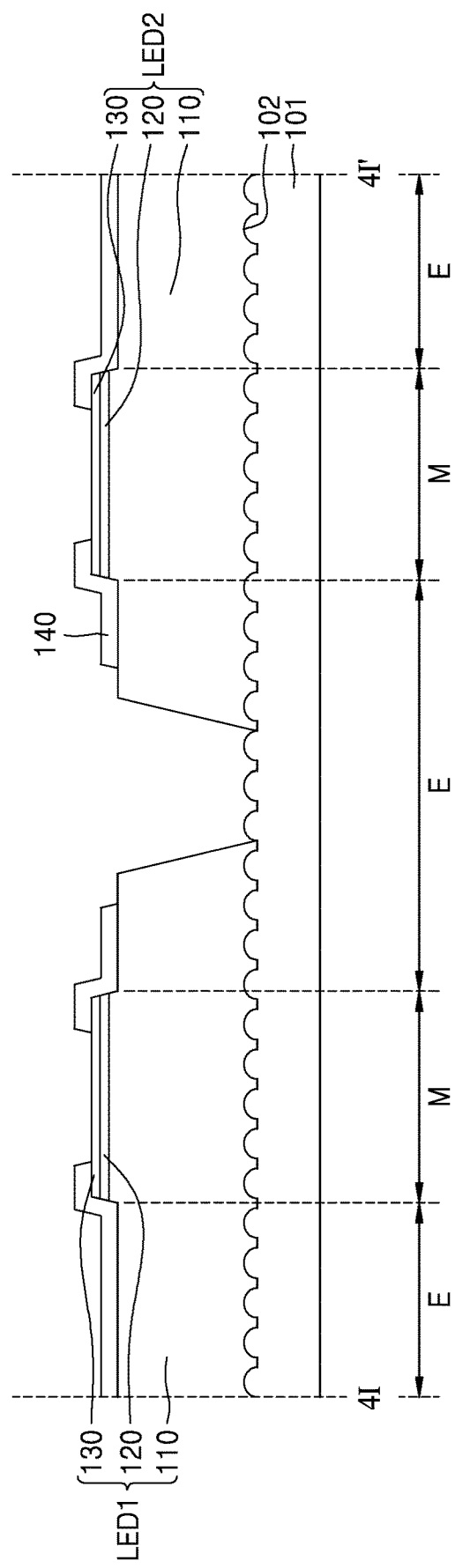

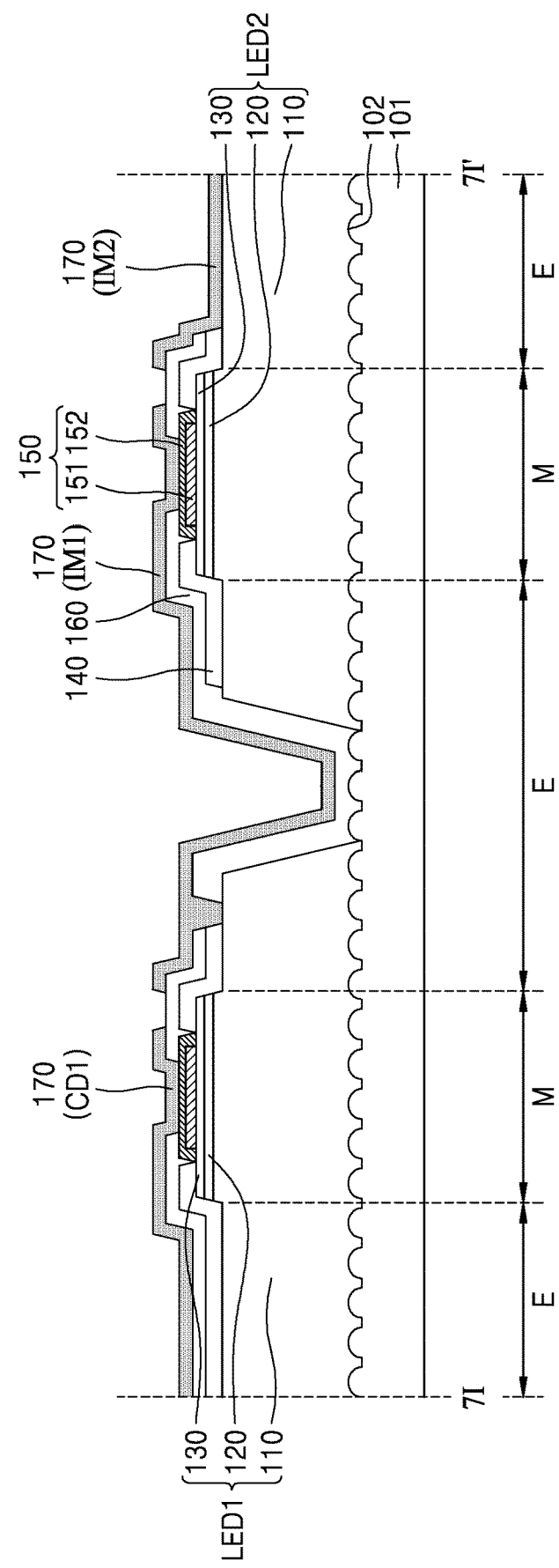

LIGHT EMITTING DEVICE

CROSS-REFERENCE TO RELATED APPLICATION

This application claims the benefit of priority to Korean Patent Application No. 10-2018-0075851, filed on Jun. 29, 2018, in the Korean Intellectual Property Office, the disclosure of which is incorporated herein in its entirety by reference.

BACKGROUND

The present disclosure relates to a light emitting device, and more particularly, to a light emitting device including a plurality of light emitting diodes (LEDs) connected in series.

An LED is widely used as a light source since the LED has advantages such as low power consumption and high brightness. In particular, recently, semiconductor light emitting devices have been employed as backlight devices for use in lighting devices and large liquid crystal displays (LCDs).

To increase energy efficiency of a light emitting device, a method of connecting a plurality of LED chips to each other in series may be employed. In this case, when individual chips each including one LED are connected in series, additional processes such as a substrate separation process, a packaging process, a mounting process, and a wiring process are separately required. Therefore, a problem of increased time required for the processes and increased manufacturing cost occurs. Accordingly, a light emitting device including a plurality of LEDs manufactured to be connected in series in a wafer level is proposed.

SUMMARY

The present disclosure describes a light emitting device which may exhibit improved reliability or other improved characteristics, and may improve certain shortcomings of existing light emitting devices.

According to an aspect of the inventive concept, there is provided a light emitting device including: a substrate extending in a first direction and a second direction; first through fourth light emitting structures spaced apart from each other in the first and second directions and arranged in a matrix form on the substrate; a plurality of first interconnection layer structures connecting the first light emitting structure to the second light emitting structure; a second interconnection layer structure connecting the second light emitting structure to the third light emitting structure; and a plurality of third interconnection layer structures connecting the third light emitting structure to the fourth light emitting structure.

According to an aspect of the inventive concept, which may include the aforementioned aspects, there is provided a light emitting device including: a first light emitting structure and a second light emitting structure each including a first conductive nitride semiconductor layer, an active layer arranged above the first conductive nitride semiconductor layer, and a second conductive nitride semiconductor layer arranged above the active layer, the first and second light emitting structures being horizontally spaced apart from each other; and an interconnection layer connecting the first conductive nitride semiconductor layer of the first light emitting structure to the second conductive nitride semiconductor layer of the second light emitting structure, wherein the second interconnection layer is a conductive layer including two portions connected to at least two respective portions of each of the first conductive nitride semiconductor layer of the first light emitting structure and the second conductive nitride semiconductor layer of the second light emitting structure.

According to another aspect of the inventive concept, there is provided a light emitting device including: a substrate extending in a first direction and a second direction; first through fourth light emitting structures spaced apart from each other in the first and second directions, and arranged in a matrix form on the substrate; a plurality of first electrodes connected to the first light emitting structure; and a plurality of second electrodes connected to the second light emitting structure; wherein the first through sixth light emitting structures each include a first conductive nitride semiconductor layer, an active layer arranged above the first conduction nitride semiconductor layer, and a second conductive nitride semiconductor layer arranged above the active layer, and horizontal widths of each of the plurality of first electrodes and the plurality of second electrodes are less than a horizontal width of the second conductive nitride semiconductor layer of any of the first through fourth light emitting structures.

BRIEF DESCRIPTION OF THE DRAWINGS

Embodiments of the inventive concept will be more clearly understood from the following detailed description taken in conjunction with the accompanying drawings in which:

FIGS. 3A-3C, 4A-4C, 5A-5C, 6A-6C, 7A-7C, and 8 are cross-sectional views and layout diagrams for describing a fabrication method of a light emitting device, according to example embodiments;

DETAILED DESCRIPTION

Figure 1:
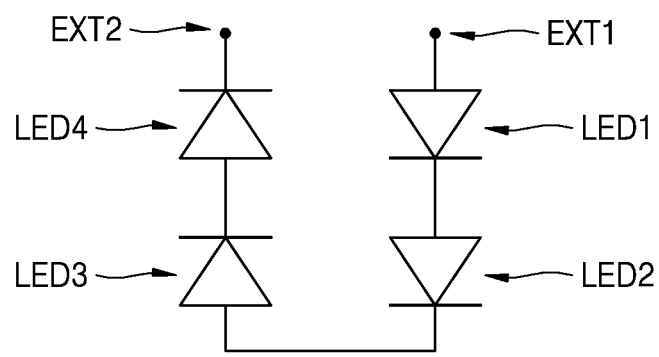
FIG. 1 is a circuit diagram of a light emitting device according to example embodiments.

Hereinafter, embodiments of the inventive concept will be described in detail with reference to accompanying drawings. The same reference numerals are used for the same configuration elements in the drawings, and a duplicate description thereof will be omitted.

FIG. 1 is a circuit diagram of a light emitting device 10 according to exemplary embodiments.

Referring to FIG. 1, the light emitting device 10 may include first through fourth light emitting structures LED1, LED2, LED3, and LED 4. The first through fourth light emitting structures LED1, LED2, LED3, and LED4 may be, for example, a group of light emitting diodes (LEDs). The first through fourth light emitting structures LED1, LED2, LED3, and LED4 may be connected in series between a first external terminal EXT1 and a second external terminal EXT2. A P junction of the first light emitting structure LED1 may be connected to the first external terminal EXT1. An N junction of the fourth light emitting structure LED4 may be connected to the second external terminal EXT2. Each external terminal may be a conductive terminal that connects to a device or component external to the light emitting device 10. An N junction of the first light emitting structure LED1 may be connected to a P junction of the second light emitting structure LED2. An N junction of the second light emitting structure LED2 may be connected to a P junction of the third light emitting structure LED3. An N junction of the third light emitting structure LED3 may be connected to a P junction of the fourth light emitting structure LED4.

When a voltage drop occurring between both ends of each of the first through fourth light emitting structures LED1, LED2, LED3, and LED4 is Vd, a voltage drop of 4Vd in total appears between the first external terminal EXT1 and the second external terminal EXT2 in the light emitting device 10 shown in FIG. 1. For example, when a voltage drop occurring between both ends of each of the first through fourth light emitting structures LED1, LED2, LED3, and LED4 is 3V, a voltage drop of 12V may occur between the first external terminal EXT1 and the second external terminal EXT2. A conversion to a high direct current (DC) voltage is possible in an alternating current (AC) to DC conversion process due to such a series connection structure, thereby improving energy efficiency.

Figure 2A:
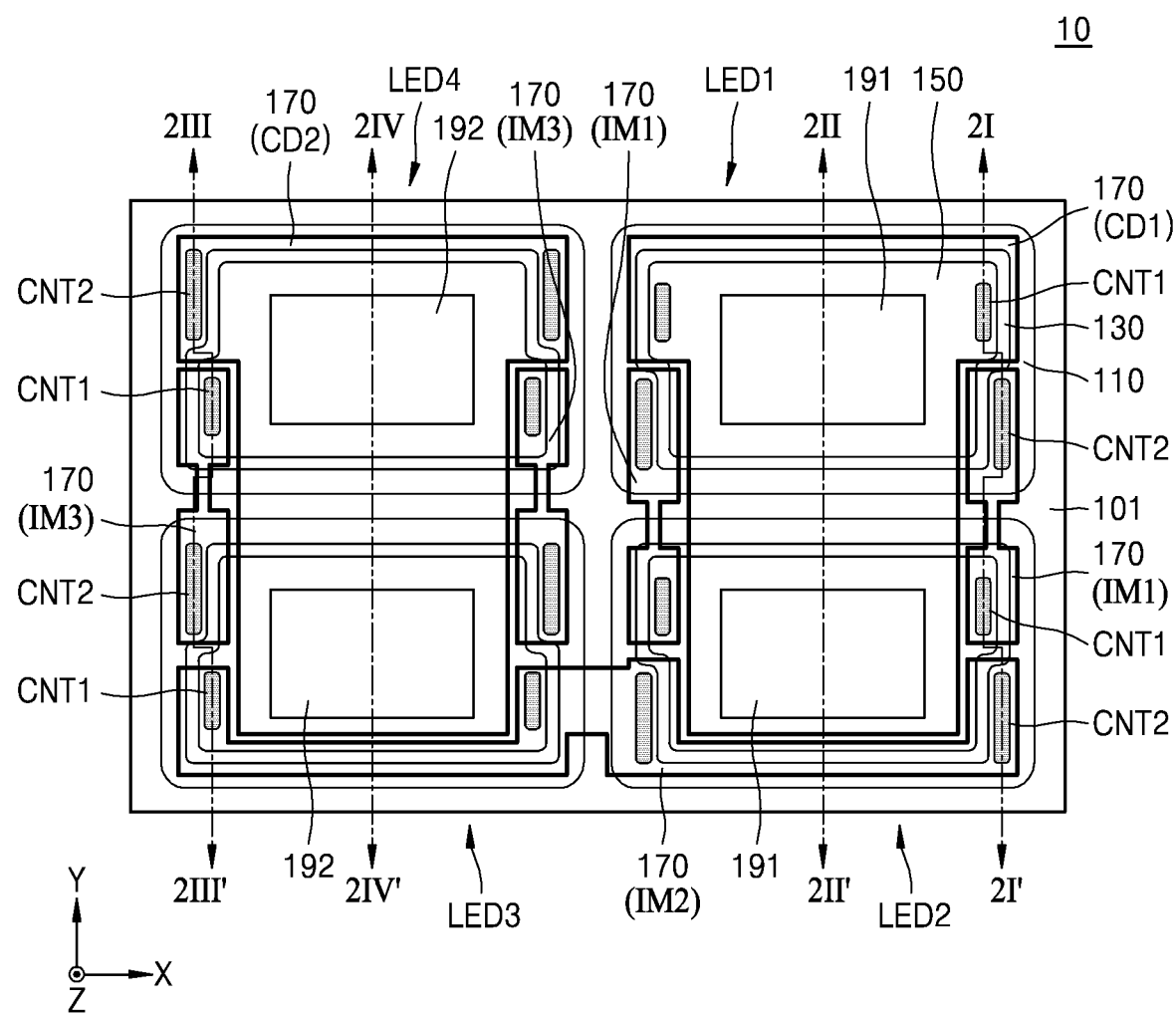
FIG. 2A is a layout diagram of a light emitting device according to example embodiments.
Figure 2B:
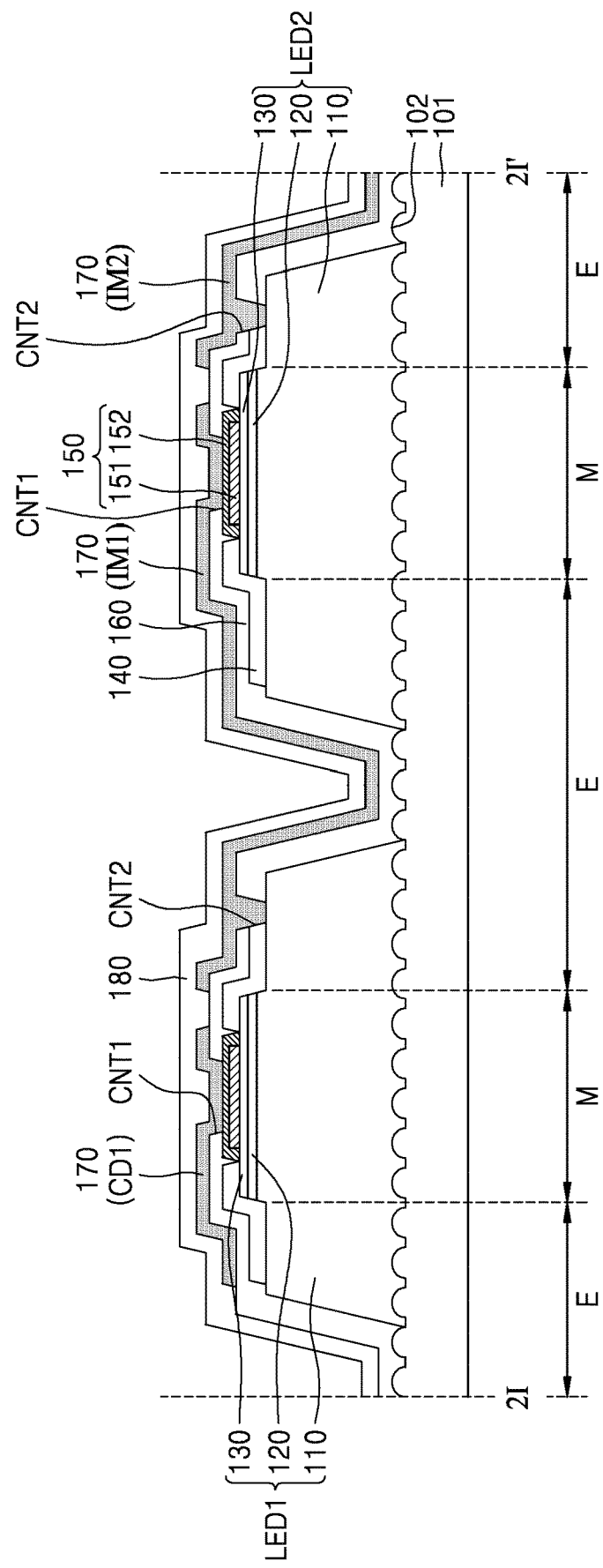
FIG. 2B is an exemplary cross-sectional view taken along line 2I-2I' in FIG. 2A.
Figure 2C:
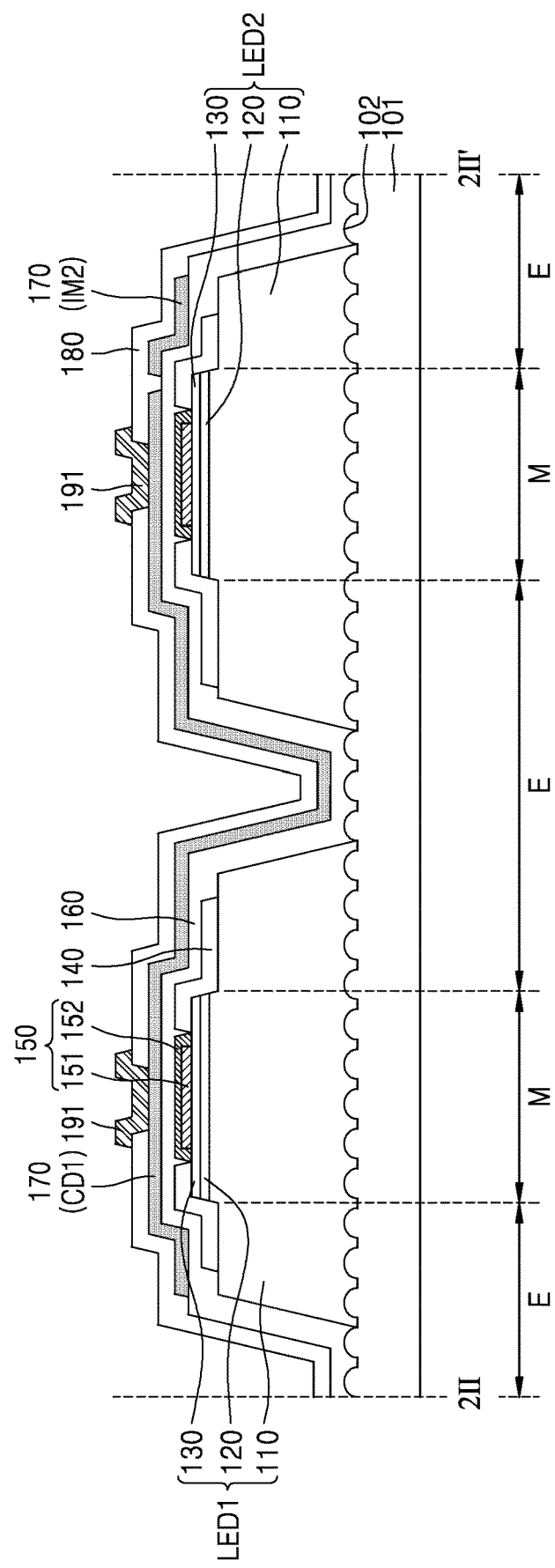
FIG. 2C is an exemplary cross-sectional view taken along line 2II-2II' in FIG. 2A.
Figure 2D:
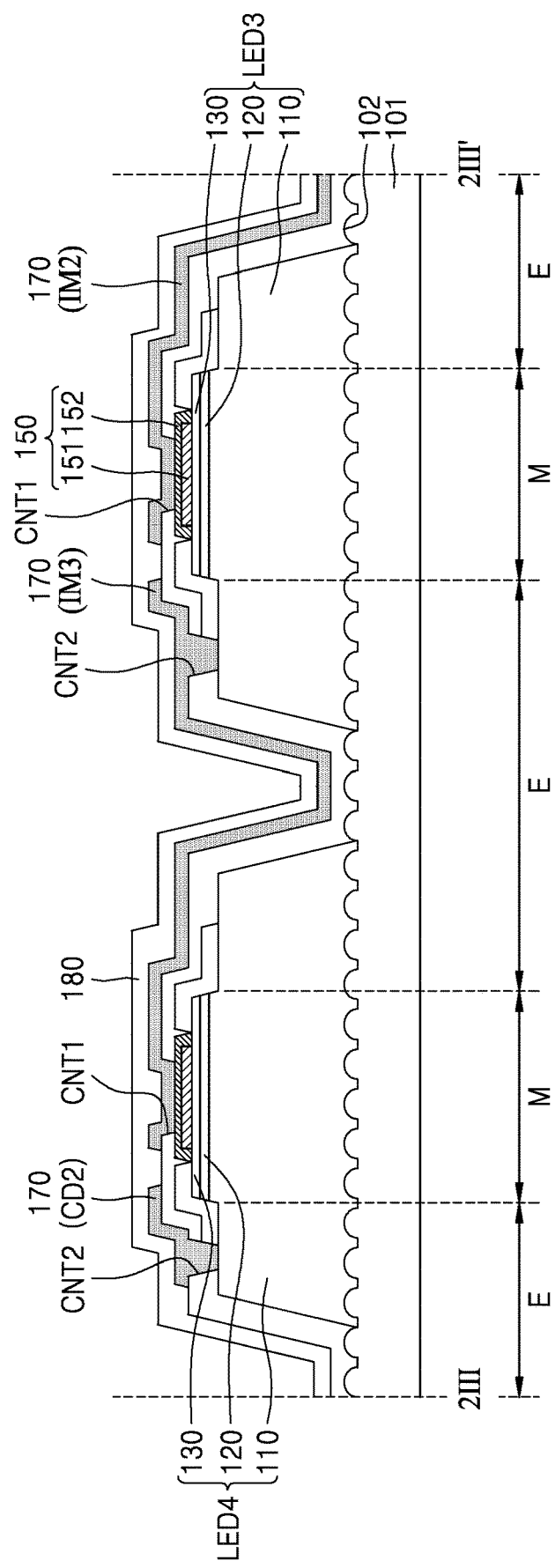
FIG. 2D is an exemplary cross-sectional view taken along line 2III-2III' in FIG. 2A.
Figure 2E:
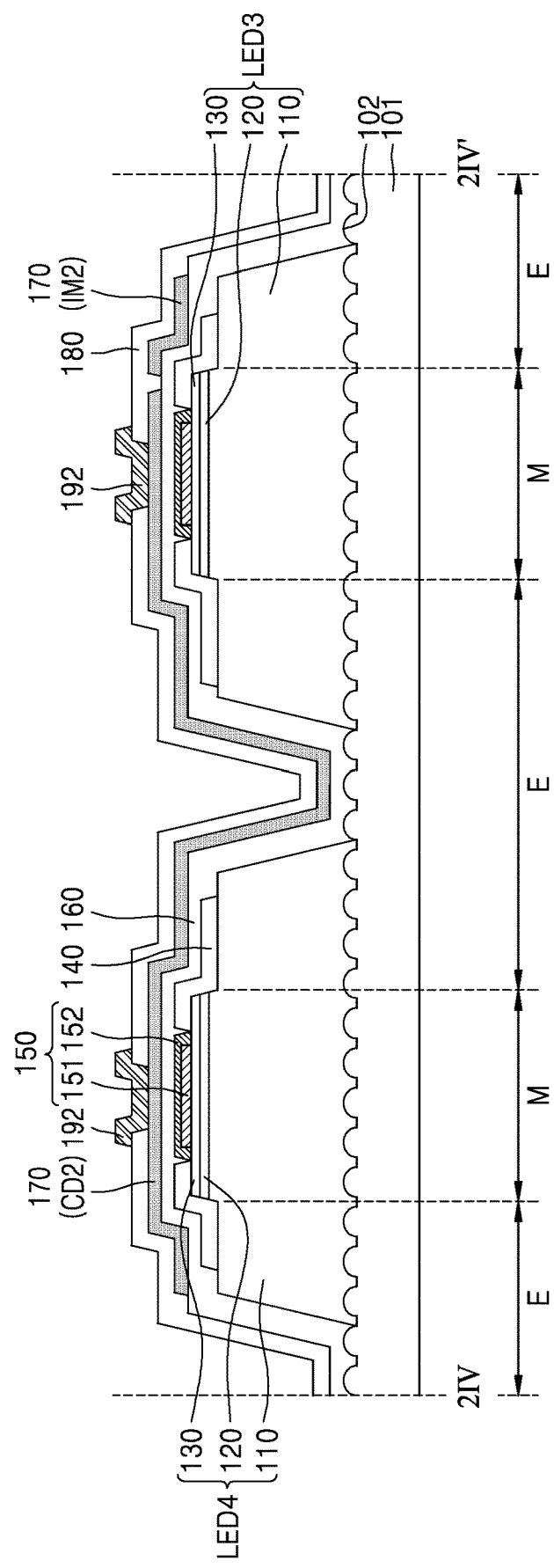
FIG. 2E is an exemplary cross-sectional view taken along line 2IV-2IV' in FIG. 2A.

FIG. 2A is a layout diagram of the light emitting device 10 according to exemplary embodiments. FIG. 2B is a cross-sectional view taken along line 2I-2I' in FIG. 2A. FIG. 2C is a cross-sectional view taken along line 2II-2II' in FIG. 2A. FIG. 2D is a cross-sectional view taken along line 2III-2III' in FIG. 2A. FIG. 2E is a cross-sectional view taken along line 2IV-2IV' in FIG. 2A.

Referring FIGS. 2A through 2E, the light emitting device 10 according to exemplary embodiments may include a substrate 101, the first through fourth light emitting structures LED1, LED2, LED3, and LED4, a first insulating pattern 140, a plurality of contact electrodes 150, a second insulating pattern 160, a conductive pattern 170, a third insulating pattern 180, and a plurality of first electrodes 191, and a plurality of second electrodes 192. It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

The substrate 101 may be provided as a growth substrate of the first through fourth light emitting structures LED1, LED2, LED3, and LED4 and may include an insulating material or a semiconductor material such as sapphire, Si, SiC, $MgAl_2O_4$, MgO, $LiAlO_2$, $LiGaO_2$, and GaN, or the like. However, the disclosure is not limited thereto, and the substrate 101 may be conductive. As a growth substrate of a nitride semiconductor layer, a sapphire substrate is a crystal having electrical insulation and a hexa-rhombo R3c symmetry, which has lattice constants of 13.001 Å and 4.758 Å respectively in a c-axis direction and an a-axis direction, and has a C plane (0001), an A plane (1120), and a R plane (1102). In this case, the C plane is relatively easy to grow a nitride film therefrom and is stable at high temperature. Therefore, the C plane is mainly used as a substrate for nitride growth.

As shown in the drawing, a plurality of concave-convex structures 102 may be formed on an upper surface of the substrate 101, that is, a surface on which the first through fourth light emitting structures LED1, LED2, LED3, and LED4 are arranged, a crystallinity and light extraction efficiency of nitride semiconductor layers stacked above the substrate 101 may be improved by the plurality of concave-convex structures 102. Referring to FIGS. 2B and 2C, the plurality of concave-convex structures 102 are shown as having a dome-shaped convex shape, but are not limited thereto. For example, the plurality of concave-convex structures 102 may be formed in various shapes such as a quadrangle, a triangle, or the like. The plurality of concave-convex structures 102 may be optionally formed and may be omitted.

Two directions parallel to and along a lower surface of the substrate 101 (that is, a surface on which the plurality of concave-convex structures 102 is not formed) are respectively defined as a first direction X and a second direction Y, while a direction substantially perpendicular to the lower surface of the substrate 101 is defined as a third direction Z. For example, the first direction X and the second direction Y may be substantially perpendicular to each other. The first direction X and the second direction Y are directions substantially perpendicular to the third direction Z. A direction indicated by arrows in the drawing and a direction opposite thereto is described in a same direction. Definitions of the aforementioned directions are the same in all subsequent figures.

The substrate 101 may be removed in a subsequent process, if required. For example, a plurality of first conductive nitride semiconductor layers 110, a plurality of active layers 120, and a plurality of second conductive nitride semiconductor layers 130 may be provided as a growth substrate and may be removed through a separation process. Particularly when the substrate 101 is conductive, the substrate 101 may be removed to prevent a short circuit between the first through fourth light emitting structures LED1, LED2, LED3, and LED4. A separation of the substrate 101 may be performed by a method such as laser lift-off or chemical lift-off.

According to one or more embodiments, a buffer layer may be further provided on the upper surface of the substrate 101. The buffer layer is a lattice defect mitigation of a semiconductor layer formed above the substrate 101 and may include an undoped semiconductor layer including nitride or the like. The buffer layer may mitigate a lattice constant difference between, for example, the substrate 101 including sapphire and the first conductive nitride semiconductor layers 110 including GaN stacked on the upper surface of the substrate 101 and may increase a crystallinity of the first conductive nitride semiconductor layers 110. The buffer layer may include undoped GaN, AlN, and InGaN, or the like and may be grown to a thickness of several tens to several hundreds of Å in a temperature of 500° C. through 600° C. Here, 'undoped' may indicate a semiconductor layer is not separately doped with impurities, but an undoped semiconductor layer may include incidental impurities at a concentration level in the semiconductor layer. For example, when a gallium nitride semiconductor layer is grown by using a metal organic chemical vapor deposition (MOCVD), Si of about $10^{14}/cm^3$ to $10^{18}/cm^3$ may be included. However, the buffer layer is not an essential element in this embodiment and may be omitted in some cases.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The first through fourth light emitting structures LED1, LED2, LED3, and LED4 shown in FIGS. 2A through 2C may respectively correspond to the first through fourth light emitting structures LED1, LED2, LED3, and LED4 shown in the circuit diagram of FIG. 1. The first through fourth light emitting structures LED1, LED2, LED3, and LED4 may be arranged in a matrix form above the substrate 101. The first light emitting structure LED1 may be spaced apart from the second light emitting structure LED2 in the second direction Y. The second light emitting structure LED2 may be spaced apart from the third light emitting structure LED3 in the first direction X. The third light emitting structure LED3 may be spaced apart from the fourth light emitting structure LED4 in the second direction Y. The fourth light emitting structure LED4 may be spaced apart from the first light emitting structure LED1 in the first direction X.

The first through fourth light emitting structures LED1, LED2, LED3, and LED4 have a structure in which a plurality of semiconductor layers are stacked, and the plurality of first conductive nitride semiconductor layers 110, the plurality of active layers 120, and the plurality of second conductive nitride semiconductor layers 130 may be sequentially stacked above the substrate 101. According to one or more embodiments, the plurality of first conductive nitride semiconductor layers 110 may be N-type nitride semiconductor layers, and the plurality of second conductive nitride semiconductor layers 130 may be P-type nitride semiconductor layers. According to one or more embodiments, the plurality of first conductive nitride semiconductor layers 110 may be P-type nitride semiconductor layers, and the plurality of second conductive nitride semiconductor layers 130 may be N-type nitride semiconductor layers. According to one or more embodiments, the plurality of first conductive nitride semiconductor layers 110 and the plurality of second conductive nitride semiconductor layers 130 may include a material which satisfies a composition formula $Al_xIn_yGa_{(1-x-y)}N$ (wherein $0 \le x \le 1$, $0 \le y \le 1$, and $0 \le x+y \le 1$). For example, the plurality of first conductive nitride semiconductor layers 110 and the plurality of second conductive nitride semiconductor layers 130 may include materials such as GaN, AlGaN, InGaN, AlInGaN, or the like.

The plurality of active layers 120 may be arranged between the plurality of first conductive nitride semiconductor layers 110 and the plurality of second conductive nitride semiconductor layers 130. The plurality of active layers 120 may emit light having predetermined energy by a recombination of electrons and holes. The plurality of active layers 120 may include a material having an energy band gap that is smaller than energy band gaps of the plurality of first conductive nitride semiconductor layers 110 and the plurality of second conductive nitride semiconductor layers 130. For example, when the plurality of first conductive nitride semiconductor layers 110 and the plurality of second conductive nitride semiconductor layers 130 are GaN compound semiconductors, the plurality of active layers 120 may include an InGaN compound semiconductor having an energy band gap that is smaller than an energy band gap of GaN. According to one or more embodiments, the plurality of active layers 120 may include a multiple quantum wells (MQW) structure in which quantum wells layers and quantum barrier layers are alternately stacked. According to one or more embodiments, the plurality of active layers 120 may include an alternately stacked structure of InGaN/GaN. However, the inventive concept is not limited thereto. The plurality of active layers 120 may include a single quantum well (SQW) structure.

The first through fourth light emitting structures LED1, LED2, LED3, and LED4 may include an etching region E where a portion of the plurality of second conductive nitride semiconductor layers 130, the plurality of active layers 120, and the plurality of first conductive nitride semiconductor layers 110 may be etched and a plurality of mesa regions M, also described as raised regions or protruding regions, defined by the etching region E.

According to one or more embodiments, the plurality of second conductive nitride semiconductor layers 130 may have an asymmetric structure. According to one or more embodiments, a layout shape of the plurality of second conductive nitride semiconductor layers 130 may be T shapes, or more generally, shapes that have two portions with a first portion wider in the X direction and a second portion less wide than the first portion in the X direction.

According to one or more embodiments, a width of a portion of the second conductive nitride semiconductor layer 130 of the first light emitting structure LED1 in the first direction X, the portion being adjacent to the second light emitting structure LED2, may be less than a width of a portion of the second conductive nitride semiconductor layer 130 of the first light emitting structure LED1 in the first direction X, the portion being far from the second light emitting structure LED2. According to one or more embodiments, an edge L1B of the second conductive nitride semiconductor layer 130 included in the first light emitting structure LED1, the edge L1B being adjacent to the second light emitting structure LED2 and substantially parallel to the first direction X, may have a length less than the length of an edge L1A opposite the edge L1B.

According to one or more embodiments, a width of a portion of the second conductive nitride semiconductor layer 130 of the second light emitting structure LED2 in the first direction X, the portion being adjacent to the first light emitting structure LED1, may be greater than a width of a portion of the second conductive nitride semiconductor layer 130 of the second light emitting structure LED2 in the first direction X, the portion being far from the first light emitting structure LED1. According to one or more embodiments, an edge L2A of the second conductive nitride semiconductor layer 130 included in the second light emitting structure LED2 in the first direction X, the edge L2A being adjacent to the first light emitting structure LED1 and substantially parallel to the first direction X, may have a greater length than the length of an edge L2B facing the edge L2A.

According to one or more embodiments, a width of the second conductive nitride semiconductor layer 130 included in the third light emitting structure LED3 in the first direction X, the portion being adjacent to the fourth light emitting structure LED4, may be less than a width of a portion of the second conductive nitride semiconductor layer 130 included in the third light emitting structure LED3 in the first direction X, the portion being far from the fourth light emitting structure LED4. According to one or more embodiments, an edge L3B of the second conductive nitride semiconductor layer 130 included in the third light emitting structure LED3, the edge L3B being adjacent to the fourth light emitting structure LED4 and substantially parallel to the first direction X, may have a length less than the length of an edge L3A facing the edge L3B.

According to one or more embodiments, a width of the second conductive nitride semiconductor layer 130 of the fourth light emitting structure LED4 in the first direction X, the portion being adjacent to the third light emitting structure LED3, may be greater than a width of a portion of the second conductive nitride semiconductor layer 130 of the fourth light emitting structure LED4 in the first direction, the portion being far from the third light emitting structure LED3. According to one or more embodiments, an edge L4A of the second conductive nitride semiconductor layer 130 included in the fourth light emitting structure LED4, the edge L4A being adjacent to the third light emitting structure LED3 and substantially parallel to the first direction X, may have a length greater than the length of an edge L4B facing the edge L4A.

A space for forming a second contact hole CNT2 described later may be provided in a portion of the second conductive nitride semiconductor layer 130 of the first light emitting structure LED1, the portion being adjacent to the second light emitting structure LED2. In addition, a space for forming a first contact hole CNT1 described later may be provided in a portion of the second conductive nitride semiconductor layer 130 of the second light emitting structure LED2, the portion being adjacent to the first light emitting structure LED1. Also, a space for forming the second contact hole CNT2 described later may be provided in a portion of the first conductive nitride semiconductor layer 110 of the third light emitting structure LED3, the portion being adjacent to the fourth light emitting structure LED4. Further, a space for forming the first contact hole CNT1 described later may be provided in a portion of the second conductive nitride semiconductor layer 130 of the fourth light emitting structure LED4, the portion being adjacent to the third light emitting structure LED3.

The first insulating pattern 140 may be arranged on a side of the mesa region M so as to cover an edge of the active layers 120. The first insulating pattern 140 may be arranged above the first through fourth light emitting structures LED1, LED2, LED3, and LED4 so as to cover at least part of each of the plurality of mesa regions M of the first through fourth light emitting structures LED1, LED2, LED3, and LED4.

According to one or more embodiments, the first insulating pattern 140 may include an insulating material. According to one or more embodiments, the first insulating pattern 140 may include silicon oxide or silicon nitride. According to one or more embodiments, the first insulating pattern 140 may include at least one of $SiO_2$, SiN, $SiO_xN_y$, $TiO_2$, $Si_3N_4$, $Al_2O_3$, TiN, AlN, $ZrO_2$, TiAlN, and TiSiN.

The first insulating pattern 140 may include a plurality of openings exposing a portion of upper surfaces of the plurality of second conductive nitride semiconductor layers 130, with respect to the first insulating pattern 140. The contact electrodes 150 may be arranged above an upper surface of the plurality of second conductive nitride semiconductor layers 130 exposed by the first insulating pattern 140. The plurality of contact electrodes 150 may contact the upper surface of the plurality of second conductive nitride semiconductor layers 130. The plurality of contact electrodes 150 may be configured to be electrically connected to the plurality of second conductive nitride semiconductor layers 130. According to one or more embodiments, the plurality of contact electrodes 150 may be omitted. In this case, a first current diffusion layer CD1 and a second current diffusion layer CD2 described later may contact the upper surface of the plurality of second conductive nitride semiconductor layers 130. As used herein, components described as "connected" or "electrically connected" may be directly connected or electrically connected, or indirectly connected or electrically connected, with components connected therebetween. The term "contact," however refers to a direction connection (e.g., touching), without intervening elements therebetween at the point of contact. Components described as electrically connected are configured such that a signal may pass from one component to the other. Therefore, an electrically conductive component physically connected to an electrically insulative component is not electrically connected to that electrically insulative component.

The plurality of contact electrodes 150 may include a plurality of reflective electrode layers 151. The plurality of reflective electrode layers 151 may cover a portion of the upper surface of the plurality of second conductive nitride semiconductor layers 130. The plurality of reflective electrode layers 151 may include one metal or metal alloy selected from a group of Cu, Al, Ni, Ag, Au, Pt, Sn, Pb, Ti, Cr, Pd, In, and Zn, or C. In particular, when the plurality of reflective electrode layers 151 include a material having high reflectivity such as aluminum or silver, the light emitting efficiency of the reflective electrode layers 151 may be improved since the plurality of reflective electrode layers 151 reflect light generated in the plurality of active layers 120. According to one or more embodiments, the plurality of reflective electrode layers 151 may include a multi-layer structure in which layers of different compositions are repeatedly stacked.

The conductive pattern 170, the plurality of first electrodes 191, and the plurality of second electrodes 192 to be described later may also include one metal or metal alloy selected from a group of Cu, Al, Ni, Ag, Au, Pt, Sn, Pb, Ti, Cr, Pd, In, and Zn, or C.

The plurality of contact electrodes 150 may further include a plurality of coating layers 152 covering the plurality of reflective electrode layers 151. Referring to FIG. 2B, the plurality of coating layers 152 are shown as covering a top and a side (e.g., top surface and side surfaces) of the plurality of reflective electrode layers 151, but are not limited thereto. For example, the plurality of coating layers 152 may cover only the upper surface of the plurality of reflective electrode layers 151. In addition, the plurality of coating layers 152 may be selectively arranged and may be omitted in some cases. According to one or more embodiments, the plurality of coating layers 152 may include an insulating material. According to one or more embodiments, the plurality of coating layers 152 may include a conductive material or semiconductor material.

The second insulating pattern 160 may be arranged above the plurality of first conductive nitride semiconductor layers 110 and the plurality of second conductive nitride semiconductor layers 130 exposed to the plurality of contact electrodes 150, and above the first insulating pattern 140. The second insulating pattern 160 may cover a side (e.g., sidewalls or side surfaces) between the adjacent plurality of first conductive nitride semiconductor layers 110. The second insulating pattern 160 may contact the side surfaces (e.g., sidewalls) of the plurality of first conductive nitride semiconductor layers 110. The first insulating pattern 140 may not be arranged on the side surfaces of the plurality of first conductive nitride semiconductor layers 110 between adjacent structures of the plurality of first conductive nitride semiconductor layers 110. The second insulating pattern 160 may include at least one of $SiO_2$, SiN, $SiO_xN_y$, $TiO_2$, $Si_3N_4$, $Al_2O_3$, TiN, AlN, $ZrO_2$, TiAlN, and TiSiN. It should be noted that from an LED array perspective, the plurality of first conductive nitride semiconductor layers 110 on a single substrate 101 may be collectively referred to as a conductive nitride semiconductor layer, or may be individually referred to as a plurality of first conductive nitride semiconductor layers 110.

When the first insulating pattern 140 and the second insulating pattern 160 have the same composition, one integrated insulating layer may be formed (e.g., it may be formed in a single process as opposed to separate processes). However, the embodiments are not limited thereto. When the first insulating pattern 140 and the second insulating pattern 160 have different compositions, two distinct layers may be configured, and may be formed in different processes.

The second insulating pattern 160 may include a plurality of first contact holes CNT1 and a plurality of second contact holes CNT2, which are openings that expose at least a portion of an underlying layer. The plurality of first contact holes CNT1 may expose a portion of an upper surface of the contact electrodes 150. The plurality of second contact holes CNT2 may expose a portion of the upper surface of the plurality of first conductive nitride semiconductor layers 110.

The conductive pattern 170 may be arranged above the second insulating pattern 160. The conductive pattern 170 may include the first current diffusion layer CD1, the second current diffusion layer CD2, first through third interconnection layers IM1, IM2, and IM3. Each of these layers are also described herein as regions or portions of the conductive pattern 170, or as structures (e.g., current diffusion layer structures or interconnection layer structures).

According to one or more embodiments, a plurality of first interconnection layers (e.g., portions) IM1 may be configured to electrically connect the first light emitting structure LED1 to the second light emitting structure LED2. According to one or more embodiments, the plurality of first interconnection layers (e.g., portions) IM1 may be configured to electrically connect to the first conductive nitride semiconductor layer 110 of the first light emitting structure LED1 to the second conductive nitride semiconductor layer 130 of the second light emitting structure LED2. According to one or more embodiments, the plurality of first interconnection layers IM1 may contact the first conductive nitride semiconductor layer 110 of the first light emitting structure LED1 and the plurality of contact electrodes 150 above the second light emitting structure LED2. According to one or more embodiments, the plurality of first interconnection layers IM1 may contact the first conductive nitride semiconductor layer 110 of the first light emitting structure LED1 in the second contact holes CNT2. According to one or more embodiments, the plurality of first interconnection layers IM1 may contact the plurality of contact electrodes 150 which are above the second light emitting structure LED2 in the first contact hole CNT1. According to one or more embodiments, the plurality of first interconnection layers IM1 may be provided in a plurality. According to one or more embodiments, the plurality of first interconnection layers IM1 may be provided in two. According to one or more embodiments, the plurality of first interconnection layers IM1 may be extend lengthwise in the second direction Y. Items described herein as extending lengthwise in a particular direction have a length greater than a width, such that the length direction is the particular direction. According to one or more embodiments, the plurality of first interconnection layers IM1 may be arranged apart from each other and the first current diffusion layer (e.g., portion) CD1 may be arranged therebetween.

According to one or more embodiments, the second interconnection layer IM2 may be configured to electrically connect the second light emitting structure LED2 to the third light emitting structure LED3. According to one or more embodiments, the second interconnection layer IM2 may be configured to electrically connect the first conductive nitride semiconductor layer 110 of the second light emitting structure LED2 to the second conductive nitride layer 130 of the third light emitting structure LED3. According to one or more embodiments, the second interconnection layer IM2 may contact the first conductive nitride semiconductor layer 110 of the second light emitting structure LED2 and the plurality of contact electrodes 150 above the third light emitting structure LED3. According to one or more embodiments, the second interconnection layer IM2 may contact the contact electrodes 150 which are above the third light emitting structure LED3 in the plurality of first contact holes CNT1. According to one or more embodiments, the second interconnection layer IM2 may contact the first conductive nitride semiconductor layer 110 of the second light emitting structure LED2 in the plurality of second contact holes CNT2. The second interconnection layers IM2 may be respectively connected to at least two portions of the first conductive nitride semiconductor layer 110 of the second light emitting structure LED2 and the second conductive nitride semiconductor layer 130 of the third light emitting structure LED3.

According to one or more embodiments, the second interconnection layer IM2 may extend lengthwise in the first direction X. According to one or more embodiments, a length of the second interconnection layer IM2 in the first direction X may be greater than lengths of each of the first through fourth light emitting structures LED1, LED2, LED3 and, LED4 in the first direction X, and may be greater than the length of the array structure formed by the first through fourth light emitting structures LED1, LED2, LED3 and, LED4, in the first direction X. According to one or more embodiments, a length of each of a the second interconnection layer IM2 in the first direction X is greater than a sum of lengths of each of the plurality of second conductive nitride semiconductor layers 130 included in the second light emitting structures LED2 and the third light emitting structures LED3 in the first direction X. According to one or more embodiments, a layout shape of the second interconnection layer IM2 is a W shape (or E shape or M shape, depending on rotational orientation). According to one or more embodiments, the second interconnection layer IM2 may surround a portion of each of the first current diffusion layer CD1 and the second current diffusion layer CD2.

According to one or more embodiments, the plurality of third interconnection layers IM3 may be configured to electrically connect the third light emitting structure LED3 to the fourth light emitting structure LED4. According to one or more embodiments, the plurality of third interconnection layers IM3 may be configured to electrically connect the first conductive nitride semiconductor layer 110 of the third light emitting structure LED3 to the second conductive nitride semiconductor layer 130 of the fourth light emitting structure LED4. According to one or more embodiments, the plurality of third interconnection layers IM3 may contact the first conductive nitride semiconductor layer 110 of the third light emitting structure LED3 and the plurality of contact electrodes 150 above the fourth light emitting structure LED4. According to one or more embodiments, the plurality of third interconnection layers IM3 may contact the first conductive nitride semiconductor layer 110 of the third light emitting structure LED3 in the second contact hole CNT2. According to one or more embodiments, the plurality of third interconnection layers IM3 may contact the plurality of contact electrodes 150 above the fourth light emitting structure LED4 in the first contact hole CNT1. According to one or more embodiments, the plurality of third interconnection layers IM3 may be provided in a plurality. According to one or more embodiments, the plurality of third interconnection layers IM3 may be provided as two separate layer structures. According to one or more embodiments, the plurality of interconnection layers IM3 may extend lengthwise in the second direction Y. According to one or more embodiments, the plurality of third interconnection layers IM3 may be spaced apart from each other and the second current diffusion layer CD2 is positioned therebetween.

As can be seen from FIGS. 2A-2D, the plurality of first interconnection layer structures (e.g., first interconnection layers IM1) may be conductive structures horizontally separated from each other (e.g., in the X direction), each including at least a portion formed at a first vertical height above the substrate (e.g., in the Z direction). Furthermore, the plurality of third interconnection layer structures (e.g., third interconnection layers IM3) may be conductive structures each horizontally separated from each other and from the plurality of first interconnection layer structures (e.g., in the X direction), each including at least a portion formed at the same first vertical height above the substrate (e.g., in the Z direction). In addition, the second interconnection layer structure (e.g., second interconnection layer IM2) may be a conductive structure horizontally separated from the plurality of first interconnection layer structures and the plurality of third interconnection layer structures. The second interconnection layer structure may also include at least a portion formed at the same first vertical height above the substrate. Also as shown, the conductive pattern 170, and therefore the interconnection layers (e.g., IM1, IM2, and IM3), are conformally formed on one or more layers below the interconnection layers.

According to one or more embodiments, the first current diffusion layer CD1 may be arranged above the first light emitting structure LED1 and the second light emitting structure LED2. According to one or more embodiments, a layout shape of the first current diffusion layer CD1 may be a T shape. According to one or more embodiments, the first current diffusion layer CD1 may extend lengthwise in the second direction Y. According to one or more embodiments, a length of the first current diffusion layer CD1 in the second direction Y may be greater than lengths of each of the first through fourth light emitting structures LED1, LED2, LED3, and LED4 in the second direction Y. A length of the first current diffusion layer CD1 in the second direction Y may be greater than lengths of each of the plurality of first interconnection layers IM1 and the plurality of third interconnection layers IM3 in the second direction Y.

According to one or more embodiments, the first current diffusion layer CD1 may be horizontally spaced apart from the plurality of the first interconnection layers IM1, the second interconnection layer IM2, and the plurality of the third interconnection layers IM3. According to one or more embodiments, the first current diffusion layer CD1 may be insulated from the plurality of the first interconnection layers IM1, the second interconnection layer IM2, and the plurality of the third interconnection layers IM3. According to one or more embodiments, the first current diffusion layer CD1 may be connected to the second conductive nitride semiconductor layer 130 of the first light emitting structure LED1 in the plurality of first contact holes CNT1. According to one or more embodiments, the first current diffusion layer CD1 may contact the plurality of contact electrodes 150 above the first light emitting structure LED1 in the plurality of first contact holes CNT1.

According to one or more embodiments, the second current diffusion layer CD2 may be arranged above the third light emitting structure LED3 and the fourth light emitting structure LED4. According to one or more embodiments, a layout shape of the second current diffusion layer CD2 may be approximately a T shape. According to one or more embodiments, the second current diffusion layer CD2 may extend lengthwise in the second direction Y. According to one or more embodiments, a length of the second current diffusion layer CD2 in the second direction Y may be greater than the lengths of each of the first through fourth light emitting structures LED1, LED2, LED3, and LED4 in the second direction Y. The length of the second current diffusion layer CD2 in the second direction Y may be greater than the lengths of each of the plurality of first interconnection layers IM1 and the plurality of third interconnection layers IM3 in the second direction Y.

According to one or more embodiments, the second current diffusion layer CD2 may be horizontally spaced apart from the plurality of first interconnection layers IM1, the second interconnection layer IM2, and the third interconnection layers IM3. According to one or more embodiments, the second current diffusion layer CD2 may be insulated from the plurality of first interconnection layers IM1, the second interconnection layer IM2, and the third interconnection layers IM3. According to one or more embodiments, the second current diffusion layer CD2 may be connected to the first conductive nitride semiconductor layer 110 of the fourth light emitting structure LED4 in the second contact hole CNT2. According to one or more embodiments, the second current diffusion layer CD2 may contact the first conductive nitride semiconductor layer 110 of the fourth light emitting structure LED4 in the plurality of second contact holes CNT2.

In a case of typical light emitting devices including a series-connected LED, when a failure occurs in one of the connection layers between a plurality of LEDs, an entire LED does not work. According to one or more embodiments, provided with a plurality of electrical paths connecting the first through fourth light emitting structures LED1, LED2, LED3, and LED4 in series, when a contact defect or an unintentional open occurs in some of the connection layers, the LED may still operate normally.

The third insulating pattern 180 may be arranged in part above the first current diffusion layer CD1 and the second current diffusion layer CD2, and the plurality of first interconnection layers IM1, the second interconnection layer IM2, and the third interconnection layers IM3. The third insulating pattern 180 may cover at least part of the first current diffusion layer CD1 and the second current diffusion layer CD2, and the plurality of first interconnection layers IM1, the second interconnection layer IM2, and the third interconnection layers IM3. The third insulating pattern 180 may include an insulation material. The third insulating pattern 180 may include at least one of $SiO_2$, SiN, $SiO_xN_y$, $TiO_2$, $Si_3N_4$, $Al_2O_3$, TiN, AlN, $ZrO_2$, TiAlN, and TiSiN. The third insulating pattern 180 may include openings exposing a portion of the first current diffusion layer CD1 and the second current diffusion layer CD2. The openings of the third insulating pattern 180 may be arranged above the mesa region M.

The plurality of first electrodes 191 and the plurality of second electrodes 192 may be arranged above the third insulating pattern 180, the first current diffusion layer CD1, and the second current diffusion layer CD2. The plurality of first electrodes 191 may be arranged above the first current diffusion layer CD1, and the plurality of second electrodes 192 may be arranged above the second current diffusion layer CD2. The plurality of first electrodes 191 and the plurality of second electrodes 192 may be respectively arranged above the plurality of first conductive nitride semiconductor layers 110. According to one or more embodiments, a width above layouts of the plurality of first electrodes 191 and the plurality of second electrodes 192 may be less than a width above layouts of the plurality of second conductive nitride semiconductor layers 130. According to one or more embodiments, a layout width (e.g., in the X and/or Y directions) of the plurality of first electrodes 191 and the plurality of second electrodes 192 may be less than a layout width of the plurality of second conductive nitride semiconductor layers 130. According to one or more embodiments, the plurality of first electrodes 191 may be arranged above the first light emitting structure LED1 and the second light emitting structure LED2. The plurality of second electrodes 192 may be arranged above the third light emitting structure LED3 and the fourth light emitting structure LED4. According to one or more embodiments, the entirety of each of the plurality of first electrodes 191 and the plurality of second electrodes 192 may vertically overlap the second conductive nitride semiconductor layers 130. According to one or more embodiments, the plurality of first electrodes 191 and the plurality of second electrodes 192 may only be arranged above the mesa regions M. According to one or more embodiments, the plurality of first electrodes 191 and the plurality of second electrodes 192 may not be arranged above the etching region E, and thus may not be formed on isolation regions formed between the different light emitting structures LED1, LED2, LED3, and LED4. In this manner, the isolation regions and plurality of first and second electrodes 191 and 192 do not vertically overlap. The plurality of first electrodes 191 and the plurality of second electrodes 192 may be conductive pads configured for receiving input signals.

The plurality of first electrodes 191 and the plurality of second electrodes 192 may include, for example, under bump metallurgy (UBM) layers. The plurality of first electrodes 191 and the plurality of second electrodes 192 may be formed with grooves in which a conductive adhesive, for example, a solder, is placed. The solder, as an external terminal, may correspond to the first external terminal EXT1 and the second external terminal EXT2 in FIG. 1. According to one or more embodiments, a short circuit may be prevented from occurring even when a defect occurs in the second insulating pattern 160 arranged on a side wall of the plurality of first conductive semiconductor layers 110, according to the plurality of first electrodes 191 and the plurality of second electrodes 192, and the solder arranged thereon are arranged above the plurality of mesa regions M.

FIGS. 3A-3C, 4A-4C, 5A-5C, 6A-6C, 7A-7C, and 8 are cross-sectional views and layout diagrams describing a fabrication method of a light emitting device according to exemplary embodiments. FIGS. 9 through 12 are cross-sectional views and layout diagrams describing a fabrication method of a light emitting device according to exemplary embodiments.

More particularly, FIGS. 3A, 4A, 5A, 6A, 7A, and 8 schematically illustrate a layout of a mask used in a fabrication process of the light emitting device according to one or more embodiments, and FIGS. 3B, 4B, 5B, 6B, and 7B are layout diagrams according to respective processes, and FIGS. 3C, 4C, 5C, 6C, and 7C are corresponding cross-sectional views.

In FIGS. 3A-3C, 4A-4C, 5A-5C, 6A-6C, 7A-7C, and 8, same reference numerals as those in FIGS. 1 through 2B denote the same members, and a duplicate description may be omitted.

Figure 3A:
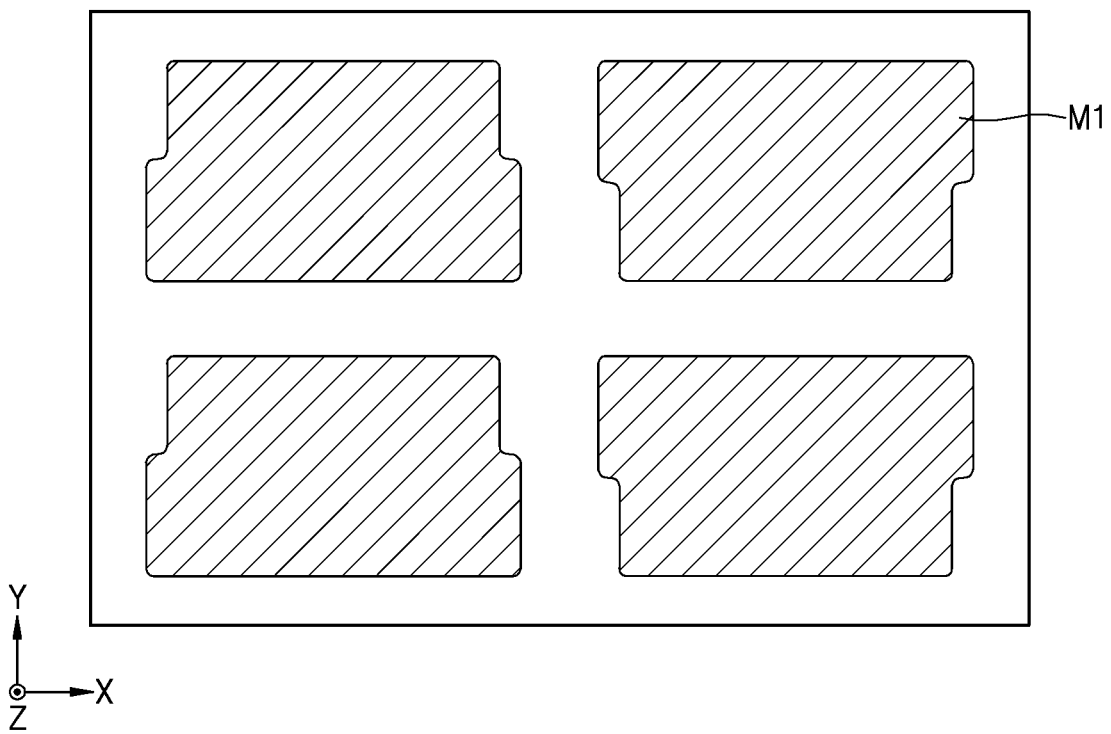
Figure 3B:
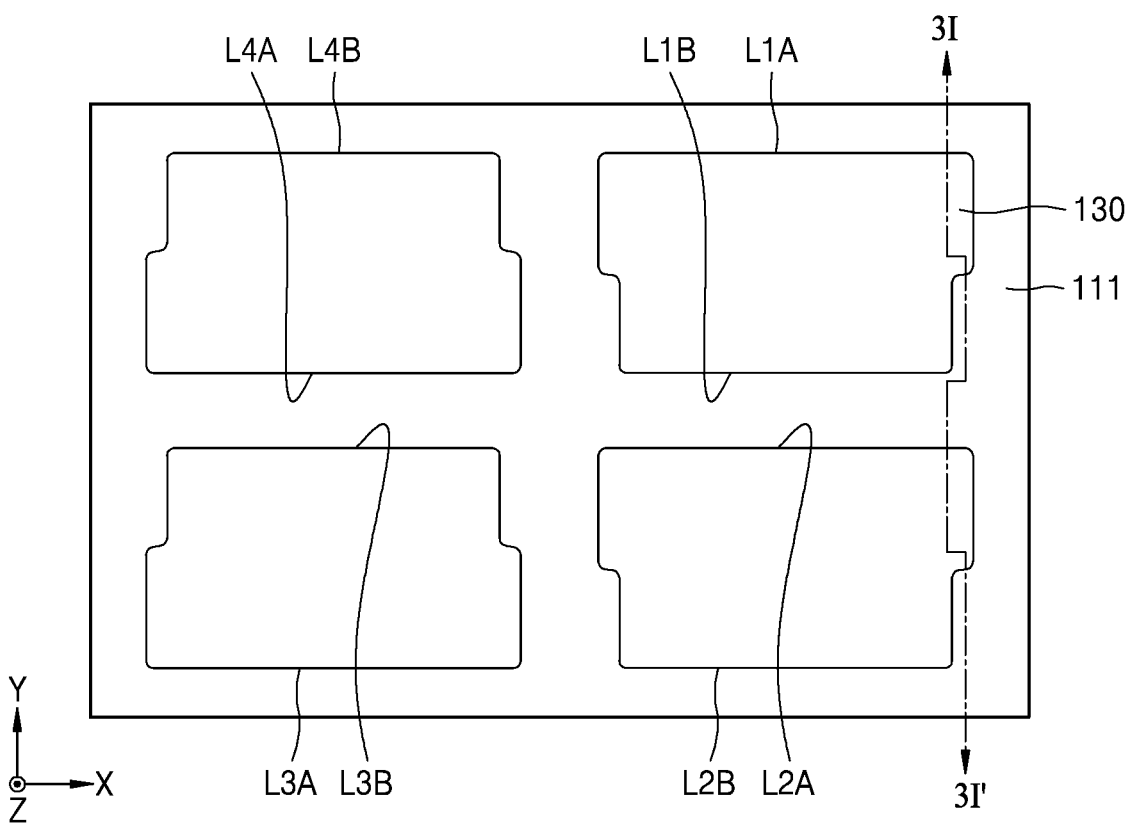
Figure 3C:
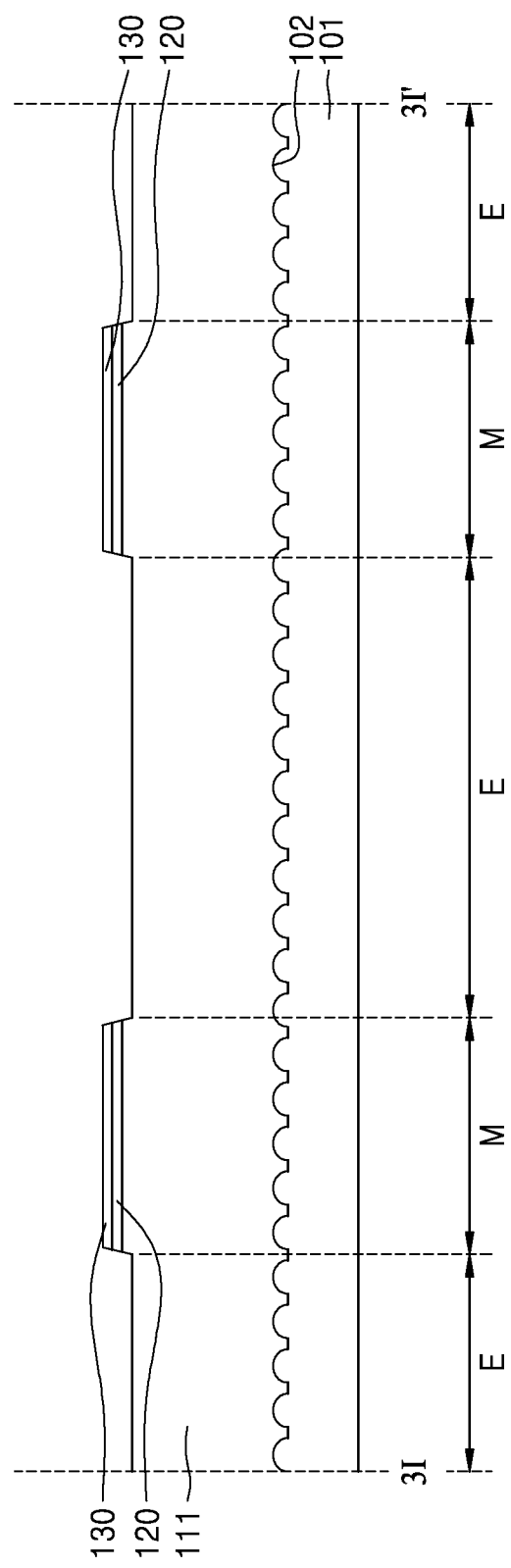

Referring to FIGS. 3A through 3C, a substrate 101 having a concave-convex structure may be provided. However, the inventive concept is not limited thereto, and the concave-convex structure of the substrate 101 may be omitted. The substrate 101 may include materials such as sapphire, Si, SiC, $MgAl_2O_4$, MgO, $LiAlO_2$, $LiGaO_2$, and GaN, or the like. Although not shown in the drawing, a buffer layer may be further formed above the substrate 101. The buffer layer may include undoped GaN, AlN, InGaN, or the like.

By using methods of a metal organic chemical vapor deposition (MOCVD), a hydride vapor phase epitaxy (HVPE), and a molecular beam epitaxy (MBE), a first conductive nitride semiconductor material layer 111, an active material layer, and a second conductive nitride semiconductor material layer may be sequentially formed on the substrate 101. Here, the first conductive nitride semiconductor material layer 111 and the second conductive nitride semiconductor material layer may respectively be an N-type nitride semiconductor layer and a P-type nitride semiconductor layer.

The second conductive nitride semiconductor material layer and the active material layer may be etched such that at least a portion of the first conductive nitride semiconductor material layer 111 is exposed, by using a first mask pattern M1 in FIG. 3A. A region of the hatched region of the first mask pattern M1 is a region where a hard mask is arranged to prevent etching of an underlying layer, and another region thereof is an etching region. The first mask pattern M1 may define the mesa region M of each light emitting structure.

After providing the mask pattern M1 above the substrate 101, the second conductive nitride semiconductor material layer and the active material layer may be wet-etched or dry-etched to form the second conductive nitride semiconductor layers 130 and the active layers 120. A shape of the first mask pattern M1 may be transferred to the second conductive nitride semiconductor layer 130 and the active layer 120 to form a mesa region M of a similar shape. Accordingly, the second conductive nitride semiconductor material layer and the active material layer may be separated from each other to form the plurality of second conductive nitride semiconductor layers 130 and the plurality of active layers 120. According to one or more embodiments, the first conductive nitride semiconductor material layer 111 may not be etched and only an upper surface thereof may be partially exposed. According to one or more embodiments, the first conductive nitride semiconductor material layer 111 may be etched to a predetermined depth by over-etching.

Figure 4A:
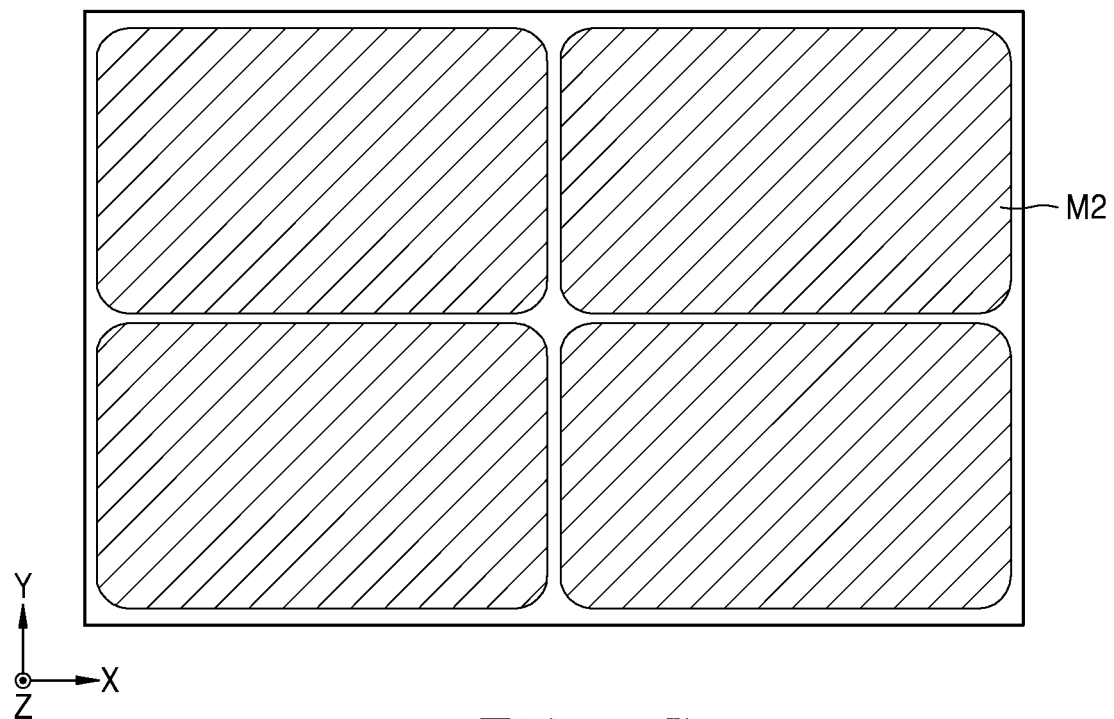
Figure 4B:
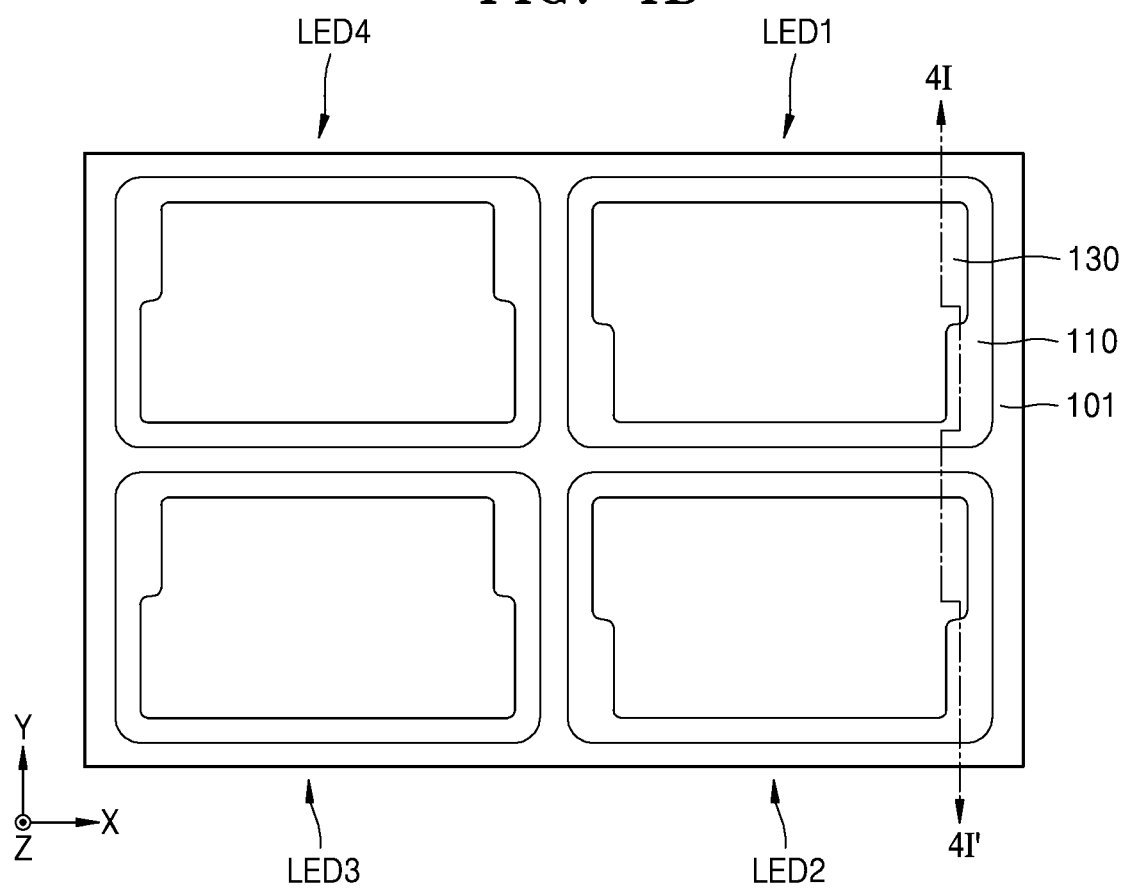

Referring to FIGS. 4A through 4C, after conformally forming a first insulating material layer above a front (e.g., top) surface of the substrate 101, the first insulating material layer and the first conductive nitride semiconductor material layer (see FIG. 4C) may be etched to expose a portion of the substrate 101 above the etching region E by a second mask pattern M2, and thus the first through fourth light emitting structures LED1, LED2, LED3, and LED4 may be formed. The first through fourth light emitting structures LED1, LED2, LED3, and LED4 may include the plurality of first conductive nitride semiconductor layers 110, the plurality of active layers 120, and the plurality of second conductive nitride semiconductor layers 130. At this time, a non-oxide or the like generated in a process of separating the first insulating material layer 111 (see FIG. 3C) may prevent a side surface of the mesa region M and an upper surface of a plurality of second conductive nitride semiconductor layers 130 from being contaminated. Then, the first insulating material layer may be etched to form the first insulating pattern 140.

Figure 5A:
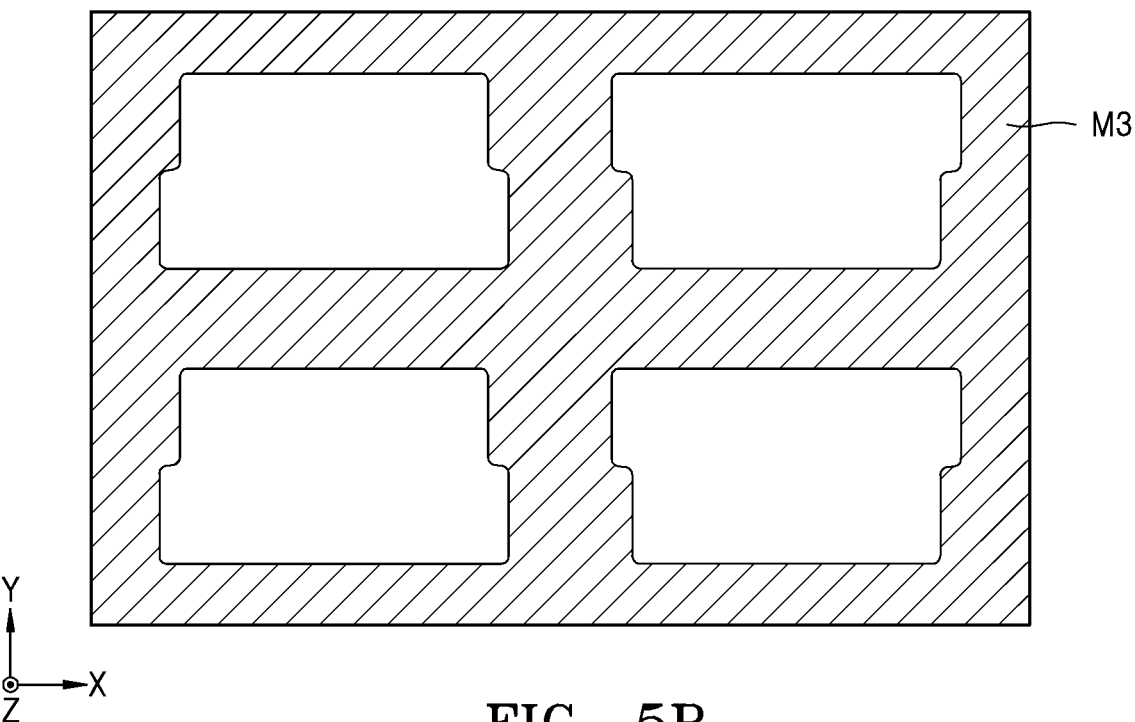
Figure 5B:
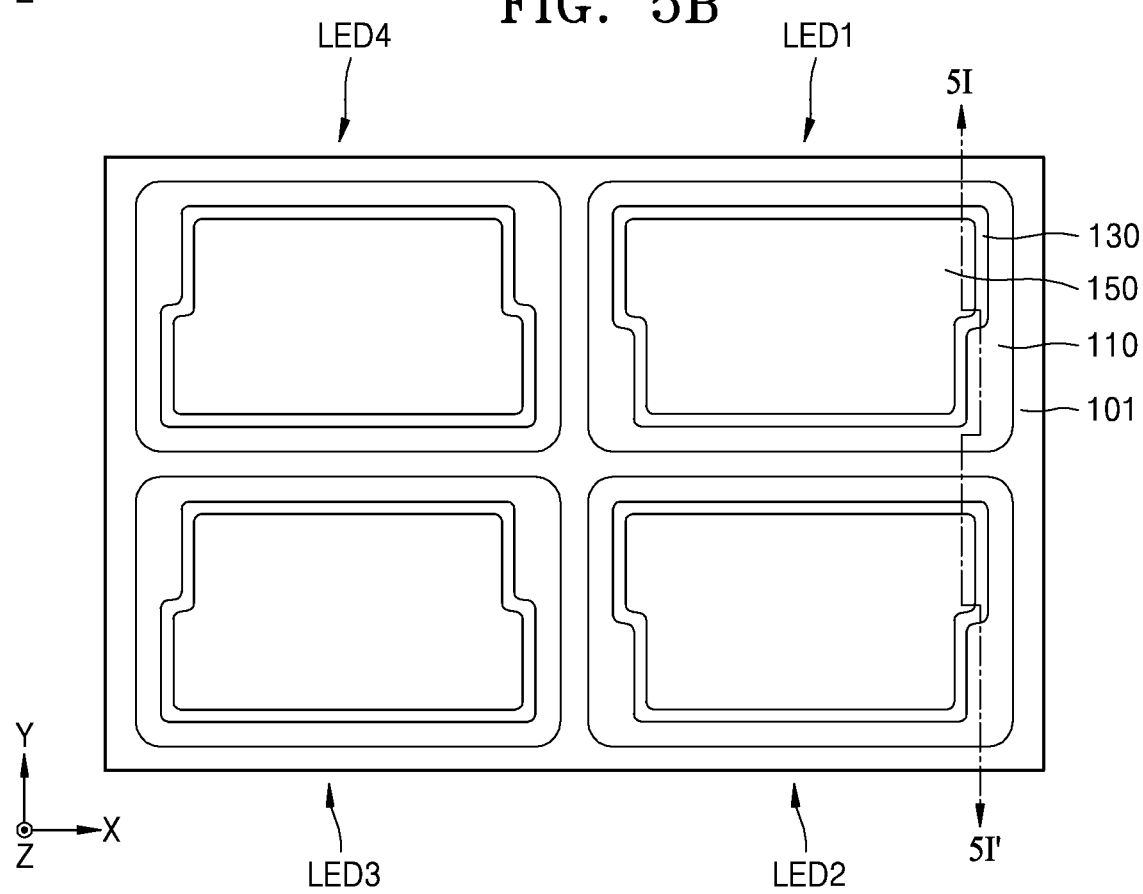
Figure 5C:
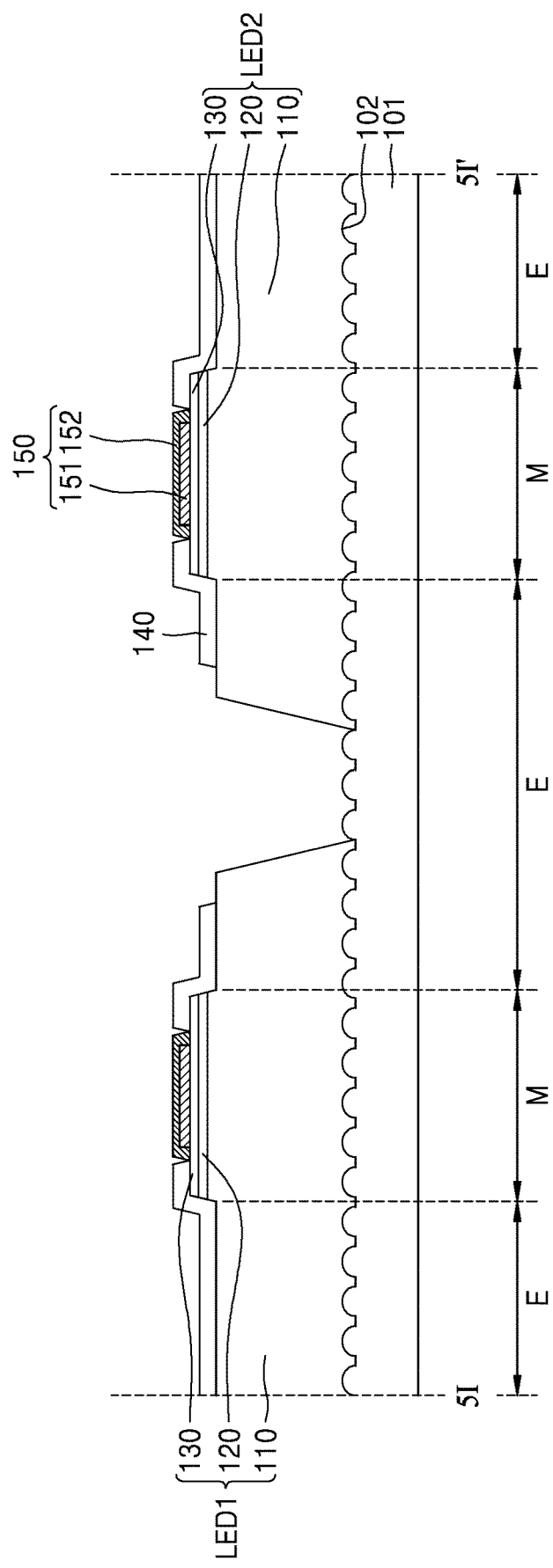

Referring to FIGS. 5A through 5C, the contact electrodes 150 may be formed above the plurality of second conductive nitride semiconductor layers 130 above the mesa region M, by using a third mask pattern M3 in FIG. 5A. After forming the third mask pattern M3 corresponding to a photoresist above a previous operation, an opening having a layout profile similar to the mesa region M may be formed in the first insulating pattern 140 above the mesa region M. The third mask pattern M3 may cover edges of the etching region E and the mesa region M. When the first insulating pattern 140 is etched by a wet process, the first insulating pattern may be more recessed in a horizontal direction than a region exposed by the third mask pattern M3.

Subsequently, a reflective electrode material layer and a covering material layer are sequentially provided above the third mask pattern M3, the third mask pattern M3 may then be removed via an ashing or a lift-off process. As a result, the reflective electrode material layer and the covering material layer covering the reflective electrode material layer are removed, the plurality of contact electrodes 150 including the plurality of reflective electrode layers 151 and the plurality of coating layers 152 are formed. As described above, the first insulating pattern 140 is horizontally recessed, and the plurality of contact electrodes 150 may be spaced apart from the first insulating pattern 140 in the horizontal direction. However, the inventive concept is not limited thereto, and the first insulating pattern 140 may contact the plurality of contact electrodes 150.

When the plurality of coating layers 152 are provided by using a sputtering process, since the sputtering is possible at various angles and a step coverage characteristic is good, the plurality of coating layers 152 may cover upper surfaces and sides of the plurality of reflective electrode layers 151. On the other hand, when the coating material layers are provided by an E-beam process, the plurality of coating layers 152 may only cover the upper surfaces of the plurality of reflective electrode layers 151.

Figure 6A:
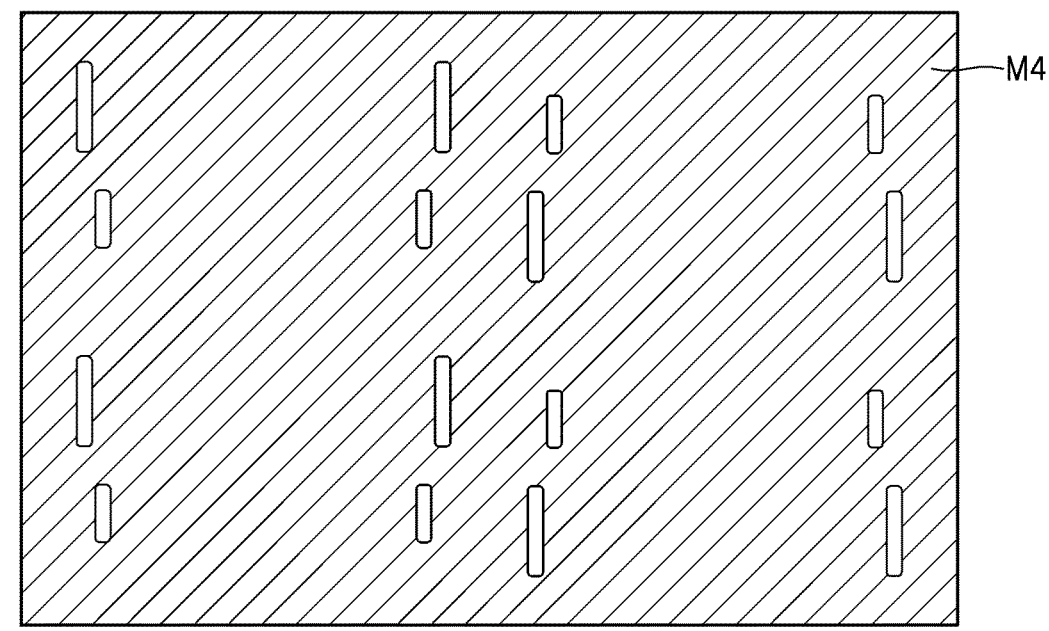
Figure 6B:
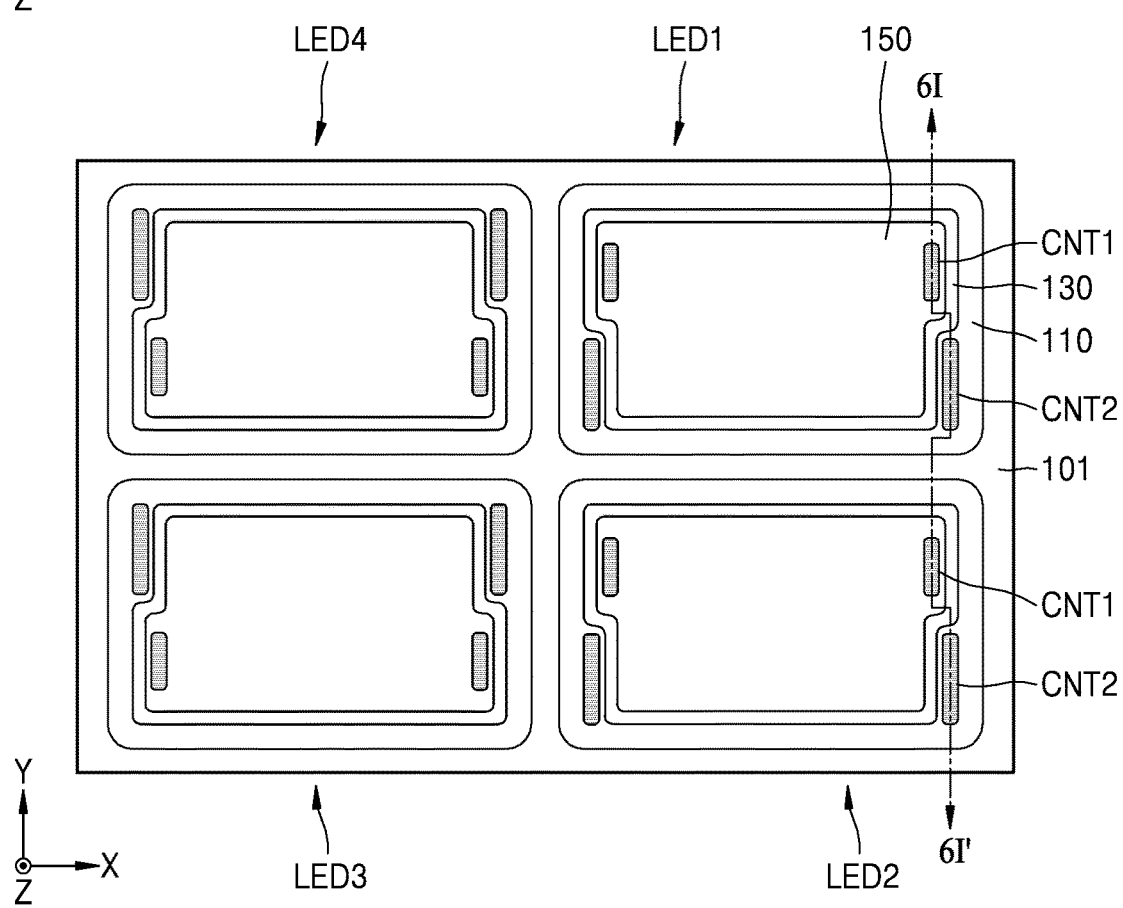
Figure 6C:
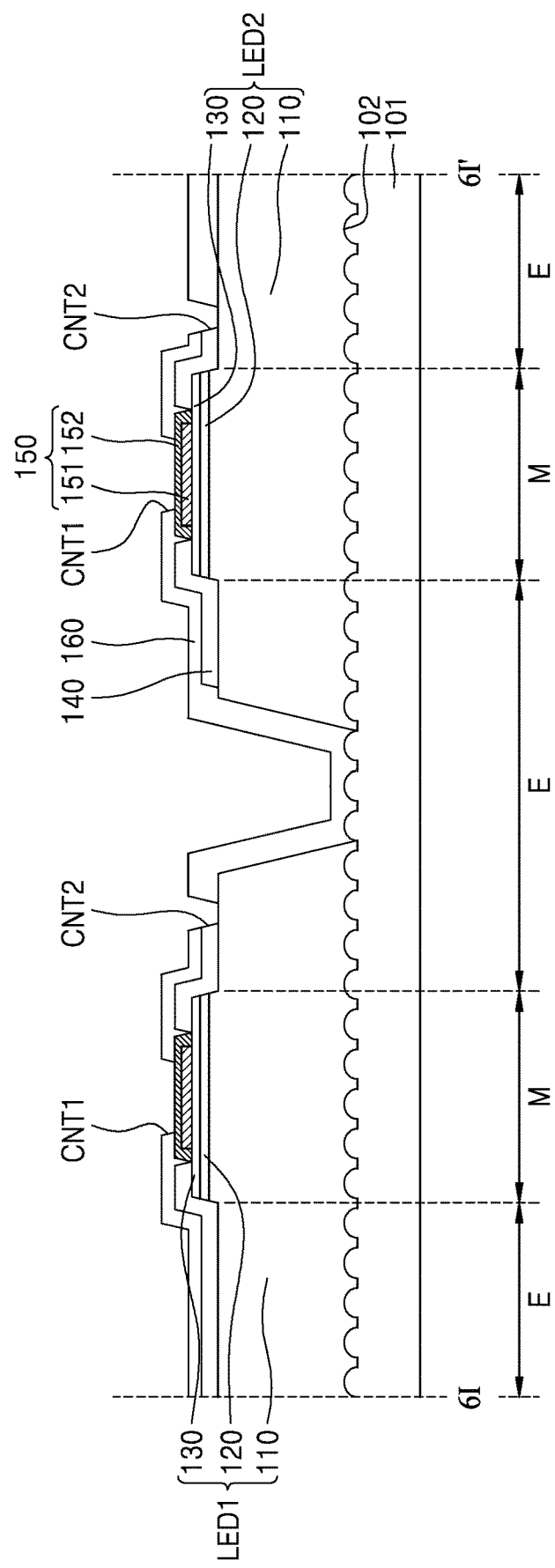

Referring to FIG. 6A through 6C, the second insulating pattern 160 forming the plurality of first contact holes CNT1 and the plurality of second contact holes CNT2 may be formed. After conformally providing the second insulating material layer, the second insulating pattern 160 may be formed by patterning the second insulating material layer by using a fourth mask pattern M4 in FIG. 6A. The second insulating pattern 160 may include a same composition as the first insulating pattern 140.

The plurality of first contact holes CNT1 and the plurality of second contact holes CNT2 of the second insulating pattern 160 may be provided for electrically connecting between adjacent ones of the first to fourth light emitting structures LED1, LED2, LED3, and LED4. The plurality of first contact holes CNT1 may partially expose a portion of an upper surface of the first conductive nitride semiconductor layers 110 of each of the first through fourth light emitting structures. The plurality of first contact holes CNT1 may partially expose a portion of an upper surface of the first conductive nitride semiconductor layer 110 of each of the first through fourth light emitting structures LED1, LED2, LED3, and LED4. The plurality of second contact holes CNT2 may partially expose upper surfaces of the plurality of contact electrodes 150 above the second conductive nitride semiconductor layers 130 of each of the first to fourth light emitting structures LED1, LED2, LED3, and LED4.

Figure 7A:
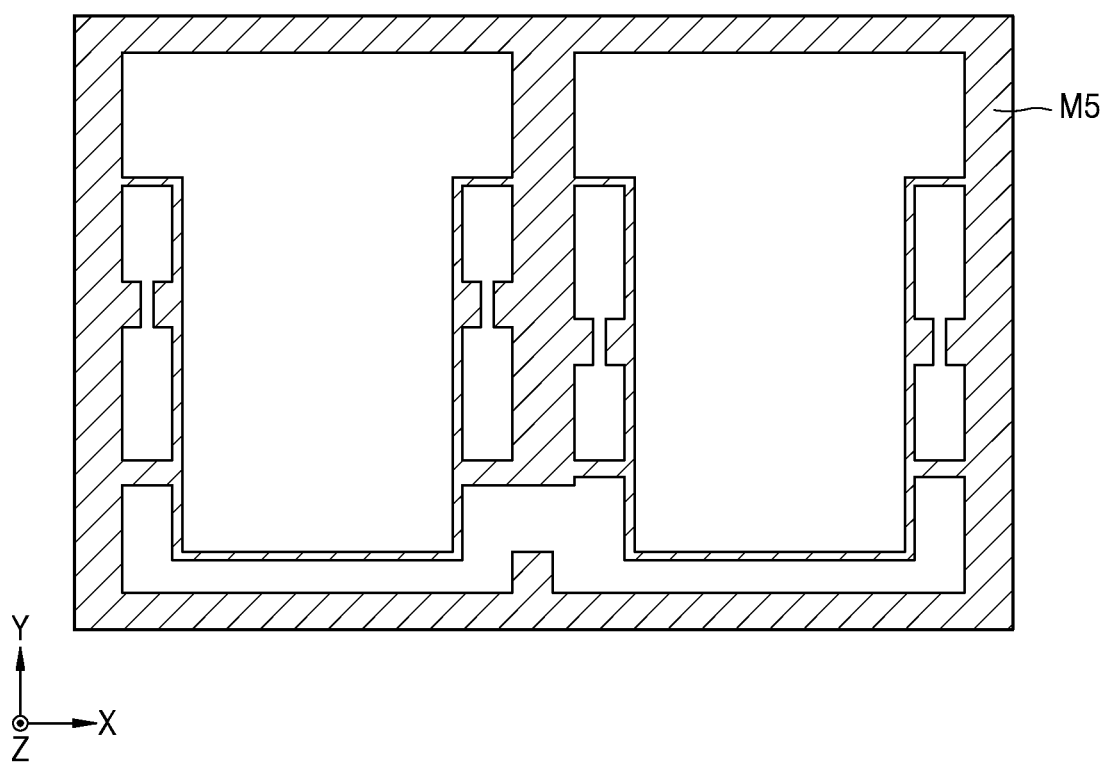
Figure 7B:
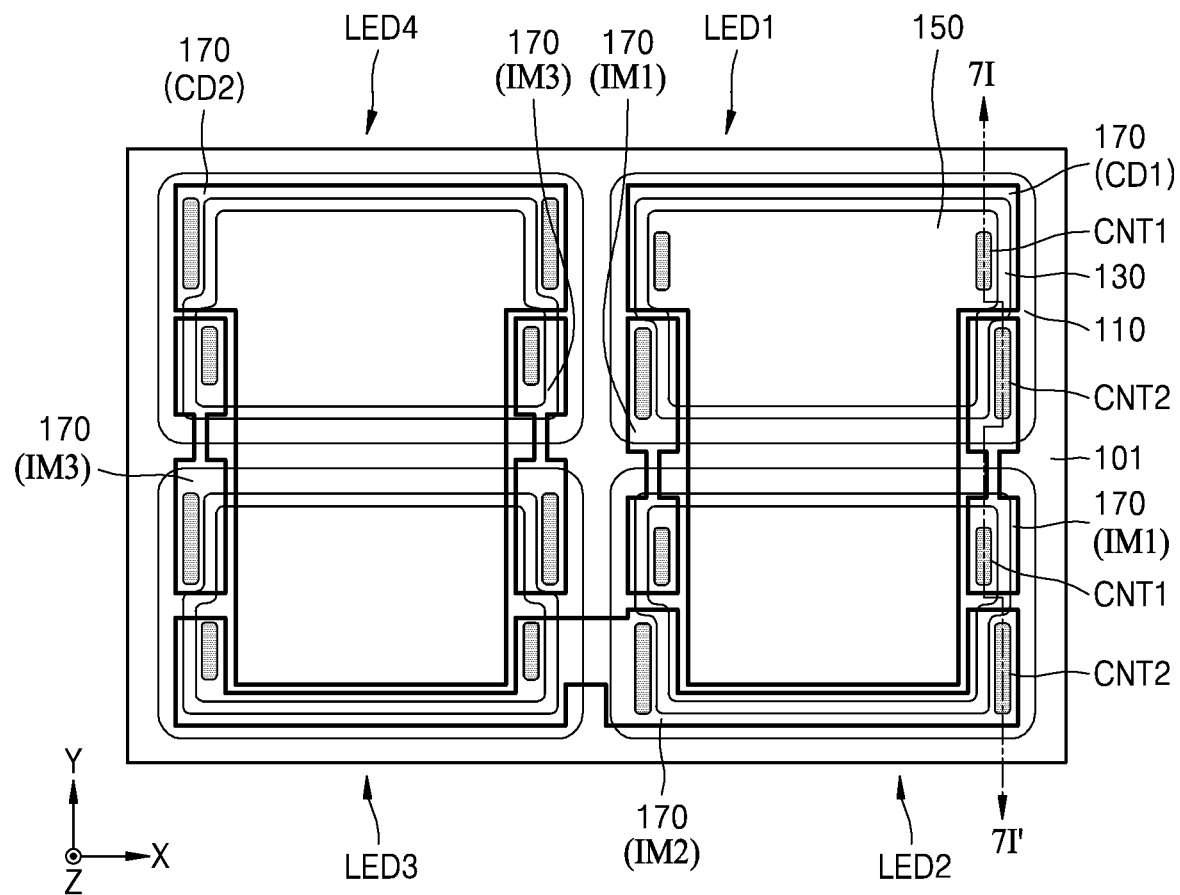
Figure 8:
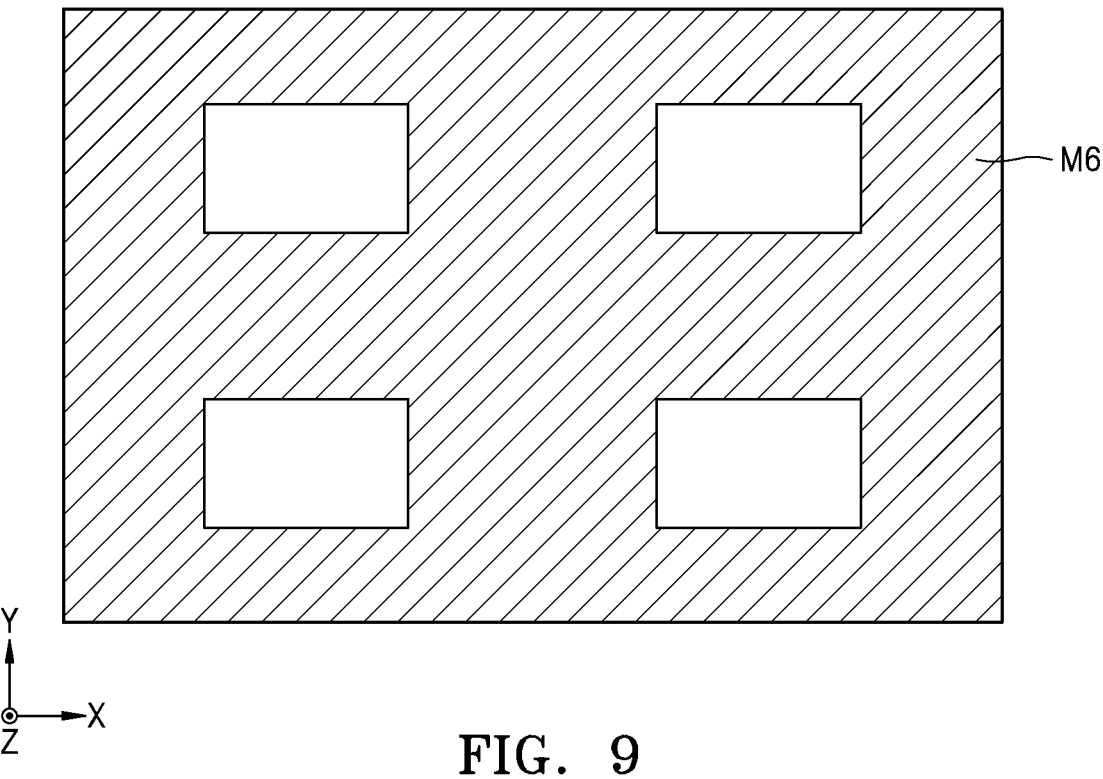

Referring to FIGS. 7A through 7C, the conductive pattern 170 is formed. The conductive pattern 170 may include the first current diffusion layer CD1, the second current diffusion layer CD2, and first through third interconnection layers IM1, IM2, and IM3. A fifth mask pattern M5 may be provided on a previous operation. The fifth mask pattern M5 may include openings in regions where the conductive pattern 170 are not formed. After conformally providing the conductive material layer above the fifth mask patter M5, the second insulating pattern 160, the contact electrodes 150, and the first conductive nitride semiconductor layers 110, the conductive pattern 170 may be formed by removing the fifth mask pattern M5 (and the conductive material formed thereon) via an ashing or a lift-off process. A shape and composition of the conductive pattern 170 are substantially same as those described with reference to FIGS. 2A through 2C.

Referring to FIG. 8 and FIGS. 2A through 2C, the third insulating pattern 180, the plurality of first electrodes 191, and the plurality of second electrodes 192 may be formed.

A third insulating material film may be conformally provided above the conductive pattern 170 and the second insulating pattern 160 exposed therebetween. The third insulating material film may include the same composition as the first insulating pattern 140.

Then, after providing a sixth mask pattern M6 having an opening formed in the mesa region M, the third insulating pattern 180 may be provided by removing a portion of the second insulating pattern exposed by the sixth mask pattern M6 of the third insulating material film. The openings of the sixth mask pattern M6 may expose upper surfaces of the first current diffusion layer CD1 and the second current diffusion layer CD2 arranged above the mesa region M. A width of the openings of the sixth mask pattern M6 (e.g., in the X and/or Y directions) may be less than the width of the mesa region M. The plurality of first electrodes 191 and the plurality of second electrodes 192 may be provided by using substantially the same method of providing the plurality of contact electrodes 150 and the conductive pattern 170.

The plurality of first electrodes 191 and the plurality of second electrodes 192 may be, for example, an UBM layer. The plurality of first electrodes 191 may be arranged above the mesa region M of the first light emitting structure LED1 and the second light emitting structure LED2. The plurality of second electrodes 192 may be arranged above the mesa region M of the third light emitting structure LED3 and the fourth light emitting structure LED4. The plurality of first electrodes 191 and the plurality of second electrodes 192 are shown to have a substantially rectangular shape, but they are not limited thereto.

Figure 9:
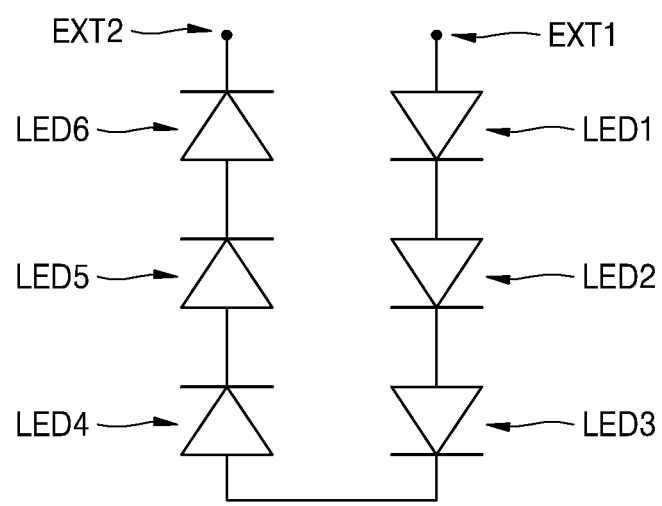
FIG. 9 is a circuit diagram of a light emitting device according to example embodiments.
Figure 10:
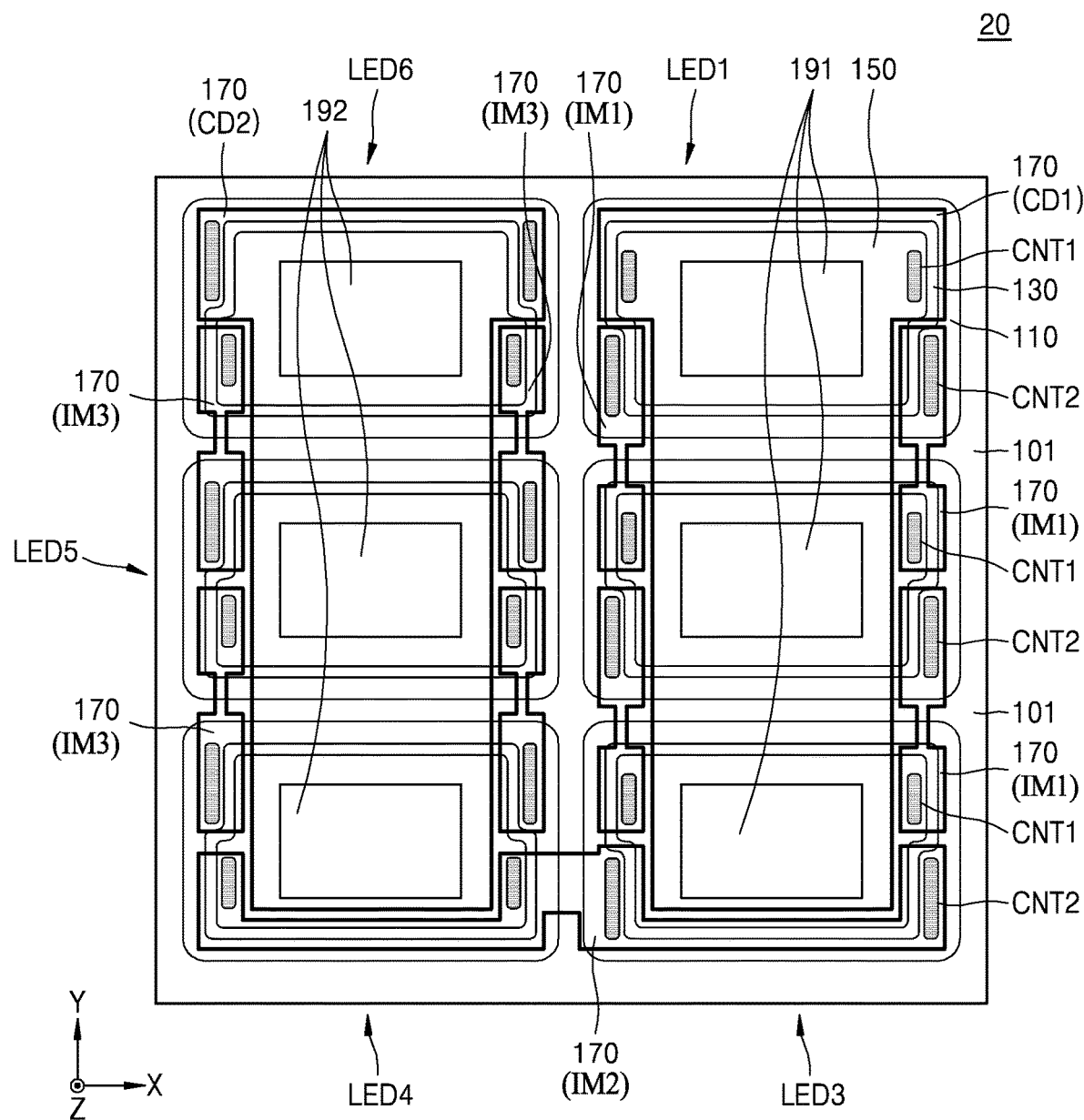
FIG. 10 is a layout diagram of a light emitting device according to example embodiments.

FIG. 9 is a circuit diagram of a light emitting device 20 according to exemplary embodiments. FIG. 10 is a layout diagram of the light emitting device 20 according to exemplary embodiments. Hereinafter, points that are same as those described with reference to FIGS. 1 through 2C will be omitted and differences will be mainly described, for convenience of explanation.

Referring to FIG. 9, the light emitting device 20 may include a first through sixth light emitting structures LED1, LED2, LED3, LED4, LED5, and LED6. The first through sixth structures LED1, LED2, LED3, LED4, LED5, and LED6 may be connected in series between the first external terminals EXT1 and the second external terminal EXT2. A P junction of the first light emitting structure LED1 may be electrically connected to the first external terminal EXT1. An N junction of the sixth light emitting structure LED6 may be electrically connected to the second external terminal EXT2. An N junction of the first light emitting structure LED1 may be connected to a P junction of the second light emitting structure LED2. An N junction of the second light emitting structure LED2 may be connected to a P junction of the third light emitting structure LED3. An N junction of the third light emitting structure LED3 may be connected to a P junction of the fourth light emitting structure LED4. An N junction of the fourth light emitting structure LED4 may be connected to a P junction of the fifth light emitting structure LED5. An N junction of the fifth light emitting structure LED5 may be connected to a P junction of the sixth light emitting structure LED6. When a voltage drop due to one light emission is generally a Vd, six light emitting structures connected in series in the light emitting device 20 corresponding to FIG. 9, a voltage drop of 6 Vd occurs.

Further, in the light emitting device in where n light emitting structures are connected in series by an above-described method, the P junction of the first light emitting structure and the N junction of the n-th light emitting structure are respectively connected to the external terminals. An N junction of (k−1)-th light emitting structure may be connected to a P junction of k-th light emitting structure. Here, n and k are integers and satisfy 1≤k≤n.

Referring to FIG. 10, the first through sixth light emitting structure LED1, LED2, LED3, LED4, LED5, and LED6 may be provided. The first conductive nitride semiconductor layer 110 of the first light emitting structure LED1 may be connected to the second conductive nitride semiconductor layers 130 of the second light emitting structure LED2 by the plurality of first interconnection layers IM1. The first conductive nitride semiconductor layers 110 of the second light emitting structure LED2 may be connected to the second conductive nitride semiconductor layers 130 of the third light emitting structure LED3 by the plurality of first interconnection layers IIVI1. The first conductive nitride semiconductor layers 110 of the third light emitting structure LED3 may be connected to the second conductive nitride semiconductor layers 130 of the fourth light emitting structure LED4 by the second interconnection layer IM2. The first conductive nitride semiconductor layers 110 of the fourth light emitting structure LED24 may be connected to the second conductive nitride semiconductor layers 130 of the fifth light emitting structure LED5 by the plurality of third interconnection layers IM3. The first conductive nitride semiconductor layers 110 of the fifth light emitting structure LED5 may be connected to the second conductive nitride semiconductor layers 130 of the sixth light emitting structure LED6 by the plurality of third interconnection layers IM3. Shapes and compositions of the plurality of first interconnection layers IM1, the second interconnection layer IM2, and the plurality of third interconnection layers IM3 in FIG. 10 may be substantially same as those of the plurality of first interconnection layers IM1, the second interconnection layer IM2, and the plurality of third interconnection layers IM3 with reference to FIG. 2.

FIGS. 11A through 11E are partial cross-sectional views describing an effect of a light emitting device according to one or more embodiments. FIGS. 11A through 11E illustrate edge portions of a light emitting device included in a light emitting device of the related art.

Referring to 11A, an etching non-oxide p1 generated when the mesa region is formed may be absorbed by the first conductive nitride semiconductor material layers 111. The etching non-oxide p1 may remain above the substrate 101 when the second mask pattern M2 is provided to separate the plurality of first conductive nitride semiconductor layers 110 from each other.

Figure 11A:
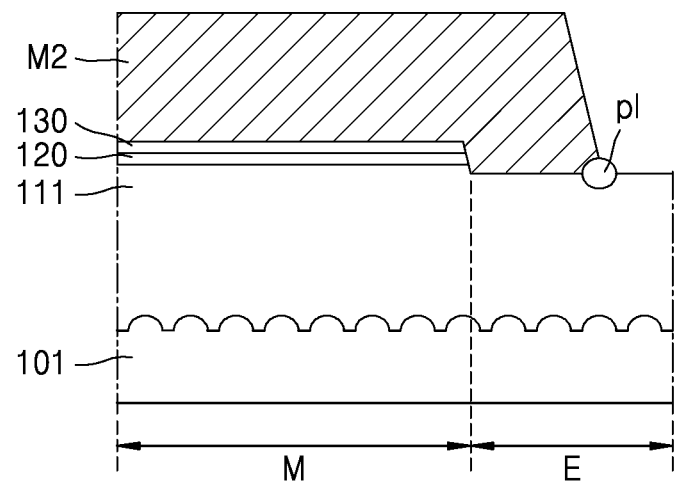
FIGS. 11A through 11E are partial cross-sectional views for describing an effect of a light emitting device according to one or more embodiments.
Figure 11B:
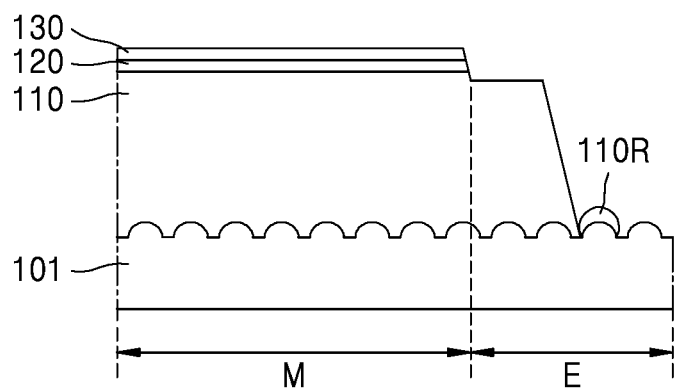

Referring to FIGS. 11A through 11B, such etching non-oxide pl may be employed as a hard mask together with the second mask pattern M2. The plurality of the first conductive nitride semiconductor layers 110 may be separated from each other and a remaining portion 110R formed by partial etch failure.

Figure 11C:
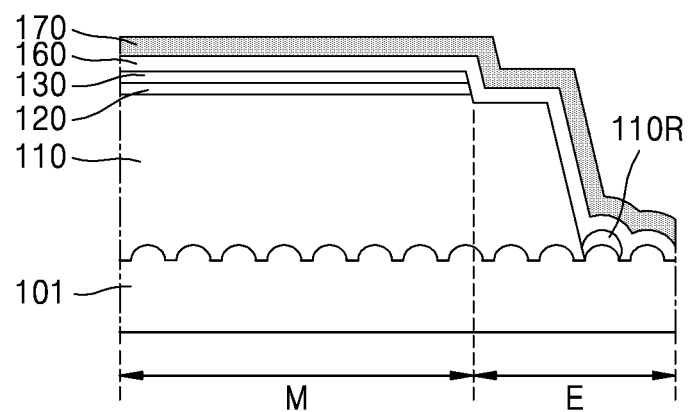
Figure 11D:
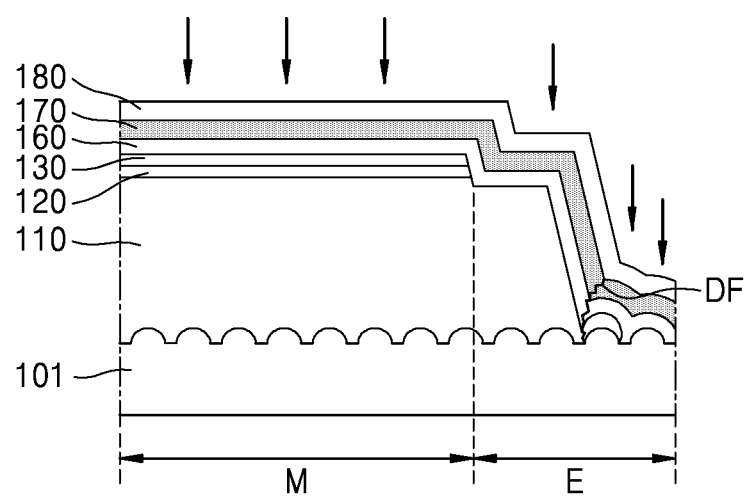

Referring to FIG. 11D, a wet-etching may be performed. Arrows in the drawing indicate a performance of wet-etching. Referring to FIGS. 11C and 11D, the second insulating pattern 160 and the conductive pattern 170 are conformally formed above the remaining portion 110R, the second insulating pattern 160 and the conductive pattern 170 formed above the remaining portion 110R are vulnerable to wet-etching. Accordingly, when the third insulating material layer is wet-etched to form the third insulating pattern 180, defects DF may occur in the second insulating pattern 160 and the conductive pattern 170.

Figure 11E:
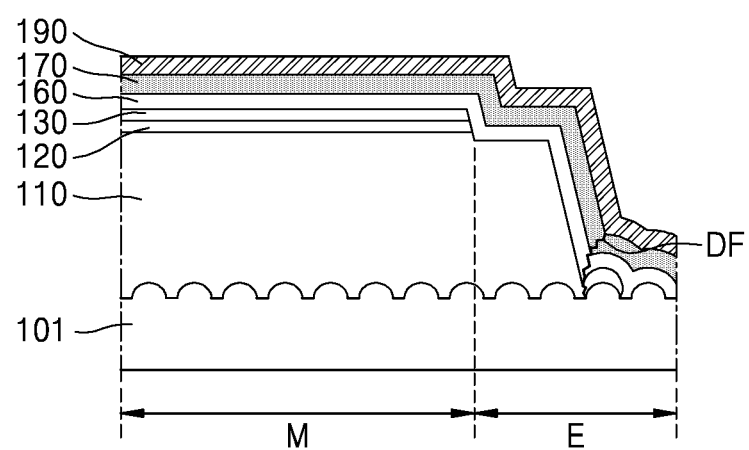

Referring to FIG. 11E, when forming the plurality of first electrodes 191 or the plurality of second electrodes 192 corresponding to the UBM, and/or forming the solder thereafter performing a reflow process, defects DF may act as a migration path of a conductive material such as solder. The plurality of first electrodes 191 and the plurality of second electrodes 192 corresponding to the UBM in the related art may be formed between separated light emitting structures, a short fail may occur between the plurality of first conductive nitride semiconductor layers 110, and the plurality of first electrodes 191 and the plurality of second electrodes 192.

According to one or more embodiments, the plurality of first electrodes 191 and the plurality of second electrodes 192 may be formed above the mesa region M as shown in FIG. 2C. Therefore, even when a portion which is not etched during the plurality of first conductive nitride semiconductor layers 110 being separated by an etched non-oxide generated when the mesa region M is formed, a short fail due to a movement of materials including the electrodes or the like may be prevented, since the plurality of first electrodes 191 and the plurality of second electrodes 192 may be arranged above the mesa region M (that is, above the second conductive nitride semiconductor layer 130).

While the inventive concept has been particularly shown and described with reference to embodiments thereof, it will be understood that various changes in form and details may be made therein without departing from the spirit and scope of the following claims.

What is claimed is:

1. A light emitting device, comprising:
a substrate extending in a first direction and a second direction;
first through fourth light emitting structures spaced apart from each other in the first and second directions and arranged in a matrix form on the substrate;
a plurality of first interconnection layer structures connecting the first light emitting structure to the second light emitting structure, wherein the plurality of first interconnection layer structures are conductive structures horizontally separated from and discontinuous in relation to each other;
a second interconnection layer structure connecting the second light emitting structure to the third light emitting structure;
a plurality of third interconnection layer structures connecting the third light emitting structure to the fourth light emitting structure, wherein the plurality of third interconnection layer structures are conductive structures horizontally separated from and discontinuous in relation to each other,
wherein:
the plurality of third interconnection layer structures are horizontally separated from and discontinuous in relation to the plurality of first interconnection layer structures,
the plurality of first interconnection layer structures each extend lengthwise in the second direction;
the plurality of third interconnection layer structures each extend lengthwise in the second direction;
the second interconnection layer structure is a conductive structure horizontally separated from and discontinuous in relation to the plurality of first interconnection layer structures and the plurality of third interconnection layer structures and extending lengthwise in the first direction;
each of the first through fourth light emitting structures comprises a first conductive nitride semiconductor layer, an active layer above the first conductive nitride semiconductor layer, and a second conductive nitride semiconductor layer above the active layer;
each of the plurality of first interconnection layer structures electrically connects the first conductive nitride semiconductor layer of the first light emitting structure to the second conductive nitride semiconductor layer of the second light emitting structure;
the second interconnection layer structure electrically connects the first conductive nitride semiconductor layer of the second light emitting structure to the second conductive nitride semiconductor layer of the third light emitting structure; and
each of the plurality of third interconnection layer structures electrically connects the first conductive nitride semiconductor layer of the third light emitting structure to the second conductive nitride semiconductor layer of the fourth light emitting structure,
a first current diffusion layer structure connected to the second conductive nitride semiconductor layer of the first light emitting structure; and
a second current diffusion layer structure connected to the first conductive nitride semiconductor layer of the fourth light emitting structure, wherein layout shapes of the first current diffusion layer structure and the second current diffusion layer structure are T shapes,
wherein lengths of the first current diffusion layer structure and the second current diffusion layer structure in the second direction are greater than lengths of each of the plurality of first interconnection layer structures and the plurality of third interconnection layer structures in the second direction.

2. The light emitting device of claim 1, wherein:
the plurality of first interconnection layer structures each include at least a portion formed at a first vertical height above the substrate;
the plurality of third interconnection layer structures each include at least a portion formed at the first vertical height above the substrate; and
the second interconnection layer structure is a conductive structure horizontally separated from and discontinuous in relation to the plurality of first interconnection layer structures and the plurality of third interconnection layer structures.

3. The light emitting device of claim 1, wherein the plurality of first interconnection layer structures are spaced apart from each other in the first direction, and the plurality of third interconnection layer structures are spaced apart from each other in the first direction.

4. The light emitting device of claim 1, wherein the second interconnection layer structure is connected to at least two portions of each of the first conductive nitride semiconductor layer of the second light emitting structure and the second conductive nitride semiconductor layer of the third light emitting structure.

5. The light emitting device of claim 1, wherein:
the first current diffusion layer structure includes a first current diffusion layer extending on the first and second light emitting structures and formed to be electrically connected to the second conductive nitride semiconductor layer of the first light emitting structure, and
the second current diffusion layer structure includes a second current diffusion layer extending on the third and fourth light emitting structures and formed to be electrically connected to the first conductive nitride semiconductor layer of the fourth light emitting structure, and further comprising:
a first electrode on the first current diffusion layer and vertically overlapping with the second conductive nitride semiconductor layer of the first light emitting structure;
a second electrode on the first current diffusion layer and vertically overlapping with the second conductive nitride semiconductor layer of the second light emitting structure;
a third electrode on the second current diffusion layer and vertically overlapping with the second conductive nitride semiconductor layer of the third light emitting structure; and
a fourth electrode on the second current diffusion layer and vertically overlapping with the second conductive nitride semiconductor layer of the fourth light emitting structure.

6. The light emitting device of claim 5,
wherein an entirety of the first electrode vertically overlaps the second conductive nitride semiconductor layer of the first light emitting structure,
wherein an entirety of the second electrode vertically overlaps the second conductive nitride semiconductor layer of the second light emitting structure, wherein an entirety of the third electrode vertically overlaps the second conductive nitride semiconductor layer of the third light emitting structure, and wherein an entirety of the fourth electrode vertically overlaps the second conductive nitride semiconductor layer of the fourth light emitting structure.

7. The light emitting device of claim 1, wherein the plurality of first interconnection layer structures are arranged to be apart from each other with the first current diffusion layer structure therebetween.

8. A light emitting device comprising:
a first light emitting structure and a second light emitting structure each comprising a first conductive nitride semiconductor layer, an active layer arranged above the first conductive nitride semiconductor layer, and a second conductive nitride semiconductor layer arranged above the active layer, the first and second light emitting structures being horizontally spaced apart from each other; and
an interconnection layer connecting the first conductive nitride semiconductor layer of the first light emitting structure to the second conductive nitride semiconductor layer of the second light emitting structure, wherein the interconnection layer is a conductive layer including two portions connected to at least two respective portions of each of the first conductive nitride semiconductor layer of the first light emitting structure and the second conductive nitride semiconductor layer of the second light emitting structure,
wherein the interconnection layer extends in a first direction, and a sum of lengths of the second conductive nitride semiconductor layers of the first and second light emitting structures in the first direction is less than a length of the interconnection layer in the first direction.

9. The light emitting device of claim 8, wherein the interconnection layer has a W shape.

10. A light emitting device comprising:
a substrate extending in a first direction and a second direction;
first through fourth light emitting structures each comprising a first conductive nitride semiconductor layer, an active layer arranged above the first conductive nitride semiconductor layer, and a second conductive nitride semiconductor layer arranged above the active layer, the first through fourth light emitting structures being spaced apart from each other in the first and second directions and arranged in a matrix form on the substrate;
a plurality of first interconnection layer structures connecting the first light emitting structure to the second light emitting structure, extending in the second direction, and separated from each other in the first direction;

a second interconnection layer structure connecting the second light emitting structure to the third light emitting structure;
a plurality of third interconnection layer structures connecting the third light emitting structure to the fourth light emitting structure, extending in the second direction, and separated from each other in the first direction;
a first current diffusion layer extending on the first and second light emitting structures and formed to be electrically connected to the second conductive nitride semiconductor layer of the first light emitting structure;
a second current diffusion layer extending on the third and fourth light emitting structures and formed to be electrically connected to the first conductive nitride semiconductor layer of the fourth light emitting structure;
a first electrode on the first current diffusion layer and vertically overlapping the second conductive nitride semiconductor layer of the first light emitting structure;
a second electrode on the first current diffusion layer and vertically overlapping the second conductive nitride semiconductor layer of the second light emitting structure;
a third electrode on the second current diffusion layer and vertically overlapping the second conductive nitride semiconductor layer of the third light emitting structure; and
a fourth electrode on the second current diffusion layer and vertically overlapping the second conductive nitride semiconductor layer of the fourth light emitting structure,
wherein lengths of the first current diffusion layer and the second current diffusion layer in the second direction are greater than lengths of each of the plurality of first interconnection layer structures and the plurality of third interconnection layer structures in the second direction.

11. The light emitting device of claim 10, wherein an entirety of the first electrode vertically overlaps with the second conductive nitride semiconductor layer of the first light emitting structure,
wherein an entirety of the second electrode vertically overlaps with the second conductive nitride semiconductor layer of the second light emitting structure,
wherein an entirety of the third electrode vertically overlaps with the second conductive nitride semiconductor layer of the third light emitting structure, and
wherein an entirety of the fourth electrode vertically overlaps with the second conductive nitride semiconductor layer of the fourth light emitting structure.

12. The light emitting device of claim 10, wherein the first current diffusion layer and the second current diffusion layer are T shapes.

* * * * *